United States Patent
Ho

(10) Patent No.: US 11,729,989 B2
(45) Date of Patent: Aug. 15, 2023

(54) DEPLETION MODE FERROELECTRIC TRANSISTORS

(71) Applicant: Iu-Meng Tom Ho, Milpitas, CA (US)

(72) Inventor: Iu-Meng Tom Ho, Milpitas, CA (US)

( * ) Notice: Subject to any disclaimer, the term of this patent is extended or adjusted under 35 U.S.C. 154(b) by 65 days.

(21) Appl. No.: 17/137,144

(22) Filed: Dec. 29, 2020

(65) Prior Publication Data

US 2021/0225854 A1 Jul. 22, 2021

Related U.S. Application Data

(60) Provisional application No. 62/957,756, filed on Jan. 6, 2020.

(51) Int. Cl.
*H10B 51/30* (2023.01)
*G11C 11/22* (2006.01)
*H01L 29/78* (2006.01)
*H10B 51/10* (2023.01)

(52) U.S. Cl.
CPC .......... *H10B 51/30* (2023.02); *G11C 11/2255* (2013.01); *G11C 11/2257* (2013.01); *H01L 29/78391* (2014.09); *H10B 51/10* (2023.02)

(58) Field of Classification Search
CPC .......... H01L 27/11587; H01L 27/1159; H01L 29/78391; G11C 11/2255; G11C 11/2257; H10B 51/10; H10B 51/20; H10B 51/30
See application file for complete search history.

(56) References Cited

U.S. PATENT DOCUMENTS

| | | | | |
|---|---|---|---|---|
| 5,196,912 A | * | 3/1993 | Matsumoto | H01L 27/115 257/66 |
| 2003/0206430 A1 | * | 11/2003 | Ho | G11C 11/22 365/145 |
| 2011/0235419 A1 | * | 9/2011 | Ishimaru | G11C 16/30 365/185.15 |

FOREIGN PATENT DOCUMENTS

| | | | | |
|---|---|---|---|---|
| CN | 100423129 C | * | 10/2008 | ............. G11C 16/30 |
| EP | 0923135 A1 | * | 6/1999 | ....... H01L 29/78391 |
| TW | 200834577 A | * | 8/2008 | ........... G11C 11/405 |
| WO | WO-2018111215 A1 | * | 6/2018 | ............. G11C 11/22 |

* cited by examiner

*Primary Examiner* — Matthew E Warren
(74) *Attorney, Agent, or Firm* — Edward C. Kwak; VLP Law Group LLP

(57) ABSTRACT

A depletion-mode FeFET ("FeDFET") is programmable to a first programmed state, under a first set of voltage biasing conditions, and to a second programmed state, under a second set of voltage biasing conditions. In both the first and second programmed states, the storage transistor has a threshold voltage that is not greater than 0 volts. A memory circuit may be organized as memory cells, with each memory cell including select transistors, transistor switches and FeDFETs in a static random-access memory (SRAM) cell configuration.

9 Claims, 20 Drawing Sheets

2 bitlines FeDFET memory cell
(Vertical arrangement)

DEPLETION MODE FERROELECTRIC TRANSISTORS

CROSS REFERENCE TO RELATED APPLICATIONS

The present invention claims priority to U.S. provisional application Ser. No. 62/957,756, entitled "DEPLETION MODE FERROELECTRIC TRANSISTORS," filed on Jan. 6, 2020, and is hereby incorporated by reference in its entirety.

BACKGROUND OF THE INVENTION

1. Field of the Invention

The present invention relates to electronic memory circuits. In particular, the present invention relates to ferroelectric memory circuits.

2. Discussion of the Related Art

Recent developments in ferroelectric materials suggest that such materials may be incorporated into state-of-the-art semiconductor manufacturing processes, such as those used in manufacturing CMOS circuits. For example, NamLab of Germany discloses a ferroelectric field-effect transistors (FeFET) that includes doped hafnium oxide ($HfO_2$)) in its gate dielectric layer. Manufactured using a 28 nm process, the FeFET may be programmed using a programming voltage as low as 1.2 volts to achieve a polarization of 10-40 $uC/cm^2$, a data retention of greater than 10 years, and an endurance rating of up to $10^9$ cycles. Other doped $HfO_2$ materials in FeFET that have exhibited ferroelectric characteristics with polarization of over 10 $uC/cm^2$ include $Si:HfO_2$ $Al:HfO_2$ $La:HfO_2$ $HfZrO_4$ $Y:HfO_2$ $Sr:HfO_2$ and $Gd:HfO_2$.

A conventional FeFET operates in two states: a low-threshold voltage ($V_T$) state and a high-$V_T$ state. The FeFET is programmed into the low-$V_T$ state (i.e., the "on" state) by a positive high voltage pulse on the gate electrode relative to the source and drain terminals (e.g., at 0 volts or lower). The FeFET is programmed into the high-$V_T$ state (i.e., the "off" state) by a negative high voltage pulse on the gate electrode relative to the source and drain terminals. The FeFET is read by applying a read voltage ($V_{read}$) to bias the gate-to-source voltage ($V_{GS}$) between the threshold voltages of the "on" and "off" states. If the FeFET is in the "on" state, the FeFET is conducting (i.e., a large drain-to-source current ($I_{DS}$)). Conversely, if the FeFET is in the "off" state, a very low $I_{DS}$ results. For a Si:HfO2 FeFET or any of the various doped HfO2 FeFETs, $V_{read}$ ranges between 1.0 volts to 6.0 volts. In other words, all current $HFO_2$-based FeFETs operates in enhancement mode.

In contrast to an enhancement mode transistor, in a conventional MOSFET operating in depletion mode, the channel is fully conductive (i.e., carrying a strong $I_{DS}$) when $V_{GS}$ is zero volts. This is achieved, for example, by ion implantation into the channel region. In an n-type MOSFET, an increasingly negative $V_GS$ bias reduces conduction. Upon reaching the device's threshold voltage ($V_T$), which is negative, conduction ceases.

One problem with current FeFETs is the difficulty in precise voltage control in their channel regions. Reliable programming of the FeFET requires using positive or negative voltages that are much higher in magnitude than what is required of a ferroelectric capacitor of equivalent materials. In a memory array, the FeFETs are typically connected directly to the major bit lines and word lines, so that normal switchings in the word lines and bit lines may unintentionally cause disturbance and, hence, data loss in the FeFETs. Therefore, it is difficult, if not impossible, to use a single FeFET-type to achieve both control and storage objectives in a memory array.

SUMMARY

According to one embodiment of the present invention, a depletion-mode FeDFET ("FeDFET") is programmable to a first programmed state, under a first set of voltage biasing conditions, and to a second programmed state, under a second set of voltage biasing conditions. In both the first and second programmed states, the storage transistor has a threshold voltage that is not greater than 0 volts.

According to one embodiment of the present invention, a memory circuit may be organized as memory cells, with each memory cell including select transistors, transistor switches and FeDFETs in a static random-access memory (SRAM) cell configuration.

According to one embodiment of the present invention, one of the transistor switches may be implemented by an enhancement-mode FeFET ("FeFET").

According to one embodiment of the present invention, various memory cell configurations may be formed using select transistors and FeDFETs. Some of the memory cell configurations may include one or more drive line select transistors.

According to one embodiment of the present invention, the memory cells may be incorporated into 2-dimensional arrays. Each memory array may include memory cells of more than one memory cell configuration.

The present invention is better understood upon consideration of the detailed description below and the accompanying drawings.

BRIEF DESCRIPTION OF THE DRAWINGS

To facilitate cross-reference among the figures, like elements may be provided like reference numerals.

DETAILED DESCRIPTION OF THE PREFERRED EMBODIMENTS

Figure 1:
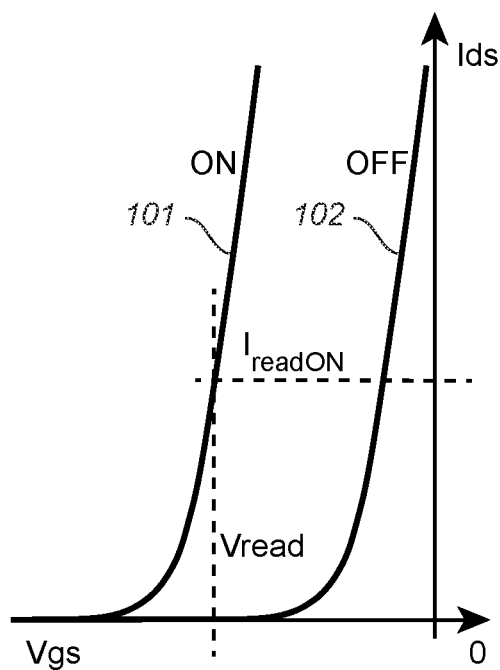
FIG. 1 shows drain-to-source current ($I_{DS}$) versus gate-to-source voltage ($V_{GS}$) curves 101 and 102 for the low-$V_T$ and high-$V_T$ states, respectively, of a FeDFET.

According to the embodiments of the present invention, the problems of the prior art FeFETs in storage applications may be overcome by an FeFET that operates in depletion mode—i.e., a ferroelectric depletion-mode field-effect transistor ("FeDFET"). FIG. 1 shows drain-to-source current ($I_{DS}$) versus gate-to-source voltage ($V_{GS}$) curves 101 and 102 for the low-$V_T$ ("on") programmed state and the high-$V_T$ ("off") programmed state, respectively, of a FeDFET. As shown in FIG. 1, the threshold voltages of both the "on" and "off" programmed states of the FeDFET are less than 0 volts. The threshold voltages of the "on" and "off" programmed states in the FeDFET may be, for example, −5.0 volts and −0.5 volts, respectively. Thus, for a read voltage ($V_{read}$) between −0.5 volts and −5.0 volts, applied across the gate and source terminals (i.e., $V_{GS}=V_{read}$), a large $I_{DS}$ current is seen when the FeDFET is in the "on" programmed state, and an insignificant $I_{DS}$ if the FeDFET is in the "off" programmed state.

Figure 2A:
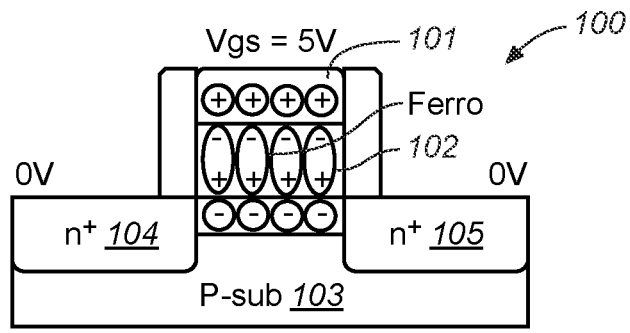
FIGS. 2(a) and 2(b) illustrate, respectively, the voltage biases for programming FeDFET 100 to the high-$V_T$ and low-$V_T$ programmed states, respectively.
Figure 2B:
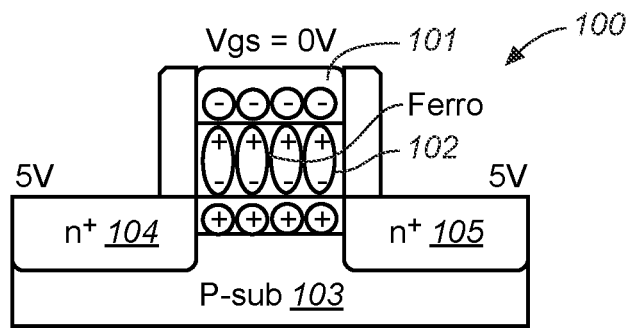

FIGS. 2(a) and 2(b) illustrate, respectively, the voltage biases for programming FeDFET 100 to the high-$V_T$ and low-$V_T$ programmed states. As shown in FIGS. 2(a) and 2(b) FeDFET 100 includes a gate electrode 101, ferroelectric layer 102, channel region 103, source region 104 and drain region 105. Note that, in this embodiment, unlike hidden bit lines used in some NAND style architecture, channel region 103 in FeDFET 100 is not fully depleted. At a $V_{GS}$ of 0.0 volts, FeDFET 100 is sufficiently conductive, such that the polarity of ferroelectric layer 102 can be switched with the minimum voltage applied on source region 104 and drain region 105. As shown in FIG. 2(a) when 5.0 volts is applied to gate electrode 101, with source region 104 and drain region 105 maintained at zero volts (i.e., $V_{GS}=5.0$ volts), the majority carriers (i.e., holes) in channel region 103 are depleted, and FeDFET is programmed into the low-$V_T$ ("on") state. Conversely, as shown in FIG. 2(b), when 0.0 volts is applied to gate electrode 101, with source region 104 and drain region 105 maintained at 5.0 volts (i.e., $V_{GS}=-5.0$ volts), the majority carriers (i.e., holes) in channel region 103 are accumulated, and FeDFET is programmed into the high-$V_T$ ("off") state.

Figure 3:
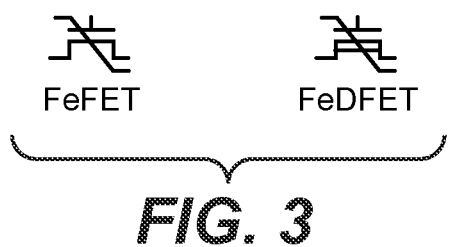
FIG. 3 shows the symbols used in the schematics described below for FeFET and FeDFET, respectively.

FIG. 3 shows the symbols used in the schematic diagrams described below for FeFET and FeDFET, respectively.

Figure 4:
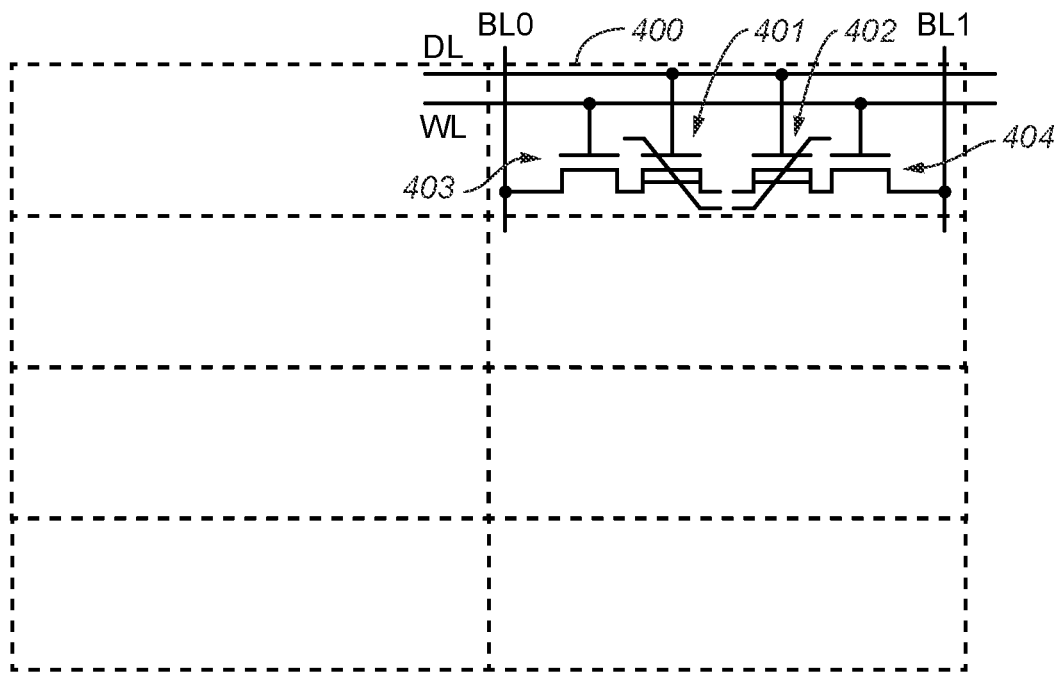
FIG. 4 shows FeDFETs 401 and 402 being used as storage transistors in a memory cell 400, according to one embodiment of the present invention.

FIG. 4 shows FeDFETs 401 and 402 being used as storage transistors in a memory cell 400, according to one embodiment of the present invention. As shown in FIG. 4, memory cell 400 is provided in a 2×4 memory array and includes NMOS transistors 403 and 404 that serve as select transistors to data storage FeDFETs 401 and 402. FeDFETs 401 and 402 are programmed or read through bit lines BL0 and BL1, word line WL and drive line DL. Memory cell 400 may be used as two independent data storage devices (i.e., as two 1T1D memory cells), or as a data storage device storing a single data bit in complementary forms (i.e., as a 2T2C memory cell).

Figure 5A:
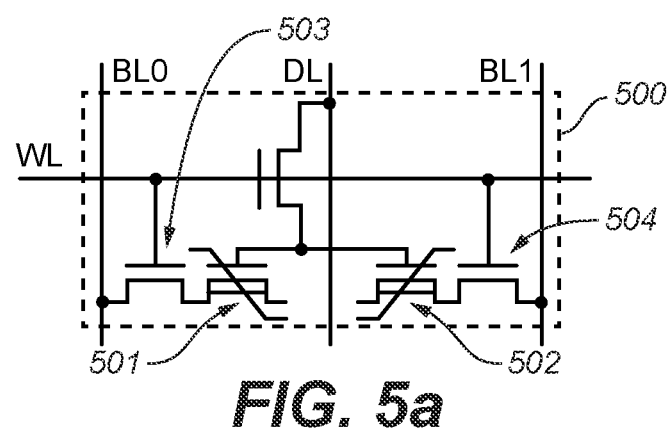
FIG. 5(a) shows FeDFETs 501 and 502 being used as storage transistors in memory cell 500, according to one embodiment of the present invention.
Figure 5B:
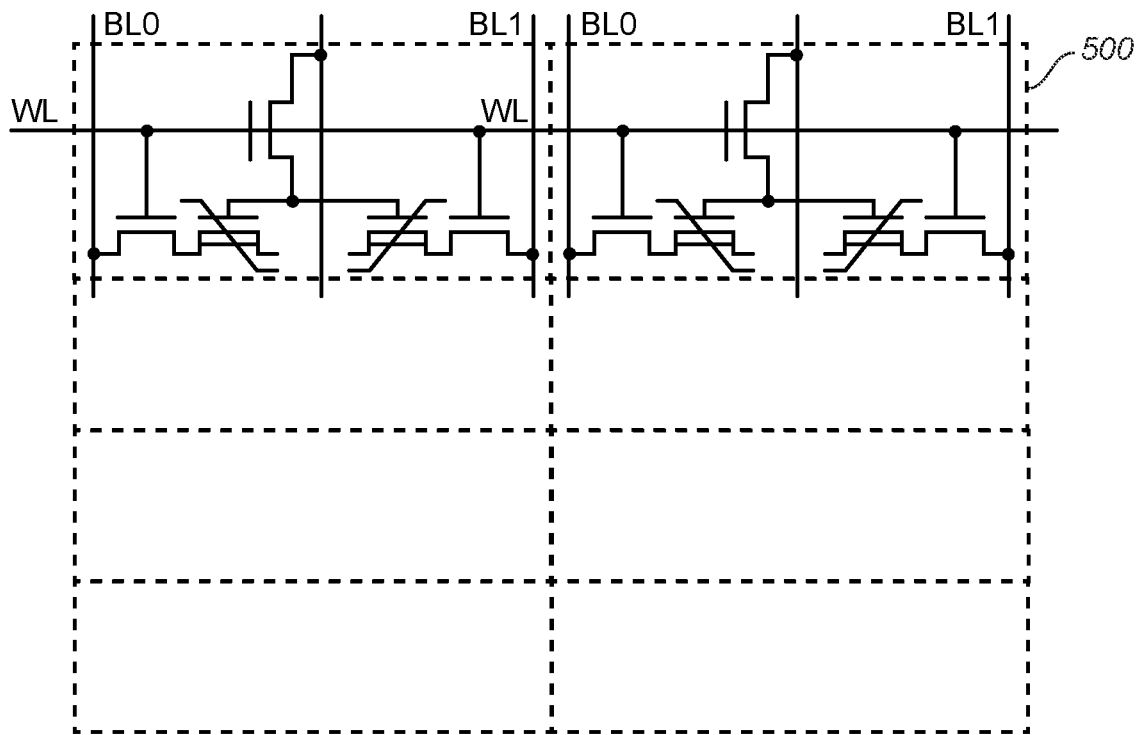
FIG. 5(b) shows memory cell 500 provided in a 2×4 memory array.

FIG. 5(a) shows FeDFETs 501 and 502 being used as storage transistors in memory cell 500, according to one embodiment of the present invention. As shown in FIG. 5(a), memory cell 500 includes NMOS select transistors 503 and 504 for accessing data storage FeDFETs 501 and 502, and common select transistor 505 for connecting drive line DL to the gate terminals of FeDFETs 501 and 502. (Although common select transistor 505 for drive line DL is shown as an NMOS transistor, it can also be implemented by a CMOS transmission gate, a PMOS transistor or an NMOS transistor with a booster). Memory cell 500 may be used as two independent data storage devices, or as a data storage device storing a single bit in complementary forms (i.e., as a 3T2C memory cell). FIG. 5(b) shows memory cell 500 provided in a 2×4 memory array.

Figure 6A:
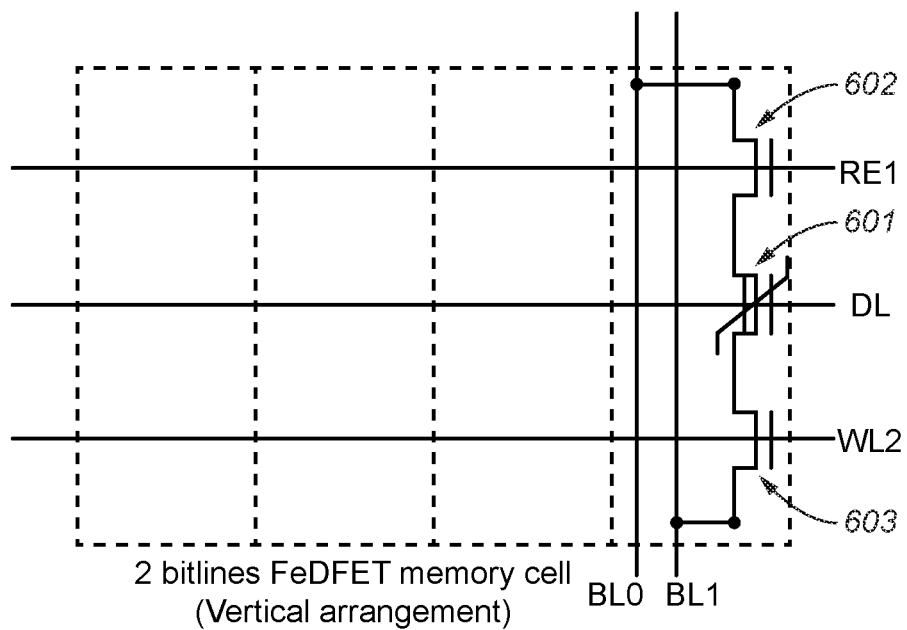
FIG. 6(a) shows FeDFET 601 being used as a storage transistor in memory cell 600, according to one embodiment of the present invention.
Figure 6B:
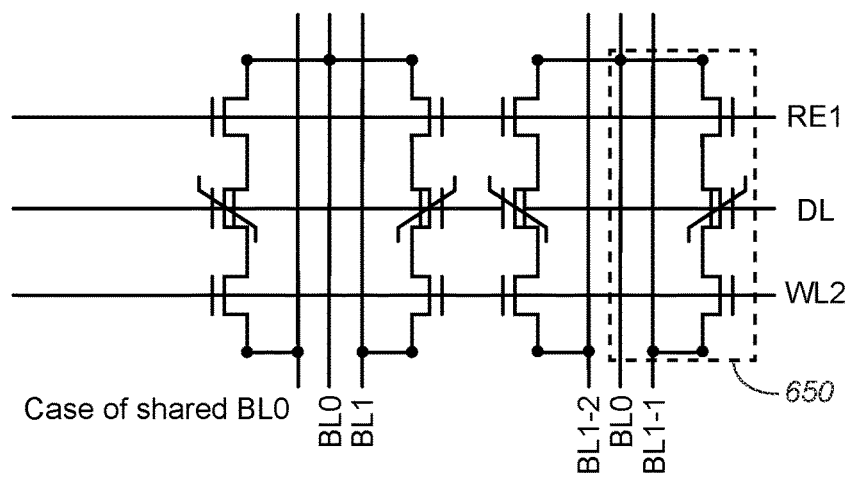
FIG. 6(b) shows adjacent memory cells in the memory array of FIG. 6(a) being made mirror images of each other to form a combined memory cell storing a single data bit in complementary forms.

FIG. 6(a) shows FeDFET 601 being used as a storage transistor in memory cell 600, according to one embodiment of the present invention. As shown in FIG. 6(a), FeDFET 601 may be accessed for a read operation through select NMOS transistor 602 and NMOS transistor 603, and for a write access operation through select NMOS transistor 603. NMOS transistors 602 and 603 are respectively controlled by word lines RE1 and WL1. (By convention, "RE" stands for "read enable".) The read and write operations are achieved using bias voltages across drive line DL and bit lines BL0 and BL1, and across drive line DL and bit line BL1, respectively. FIG. 6(a) shows memory cell 600 to be placed in a 1×4 memory array. In one embodiment, shown in FIG. 6(b), adjacent memory cells in the memory array of FIG. 6(a) are made mirror images of each other to form combined memory cell 650, which stores a single data bit in complementary forms. The two adjacent memory cells can share bit line BL0 for read access, in conjunction with word lines RE1 and WE1, drive line DL and bit lines BL1 and BL2. Write data access is achieved using word line WE1, drive line DL and bit lines BL1-1 and BL1-2. Word line RE1 is activated to maintain a bias voltage across the drain and source terminals of FeDFET 601 during a read operation.

Figure 7A:
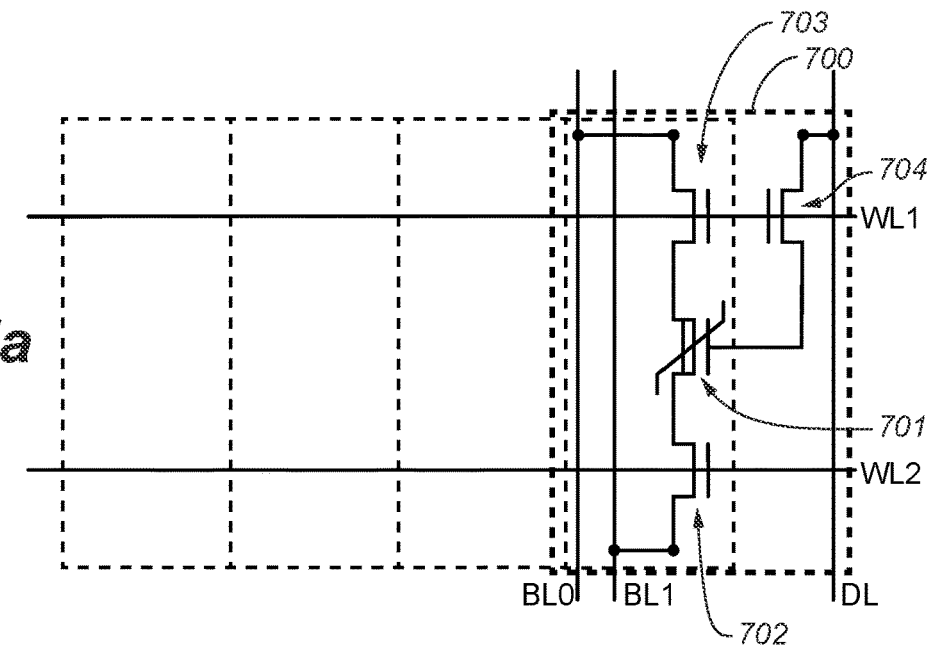
FIG. 7(a) shows FeDFET 701 being used as a storage transistor in memory cell 700, according to one embodiment of the present invention.
Figure 7B:
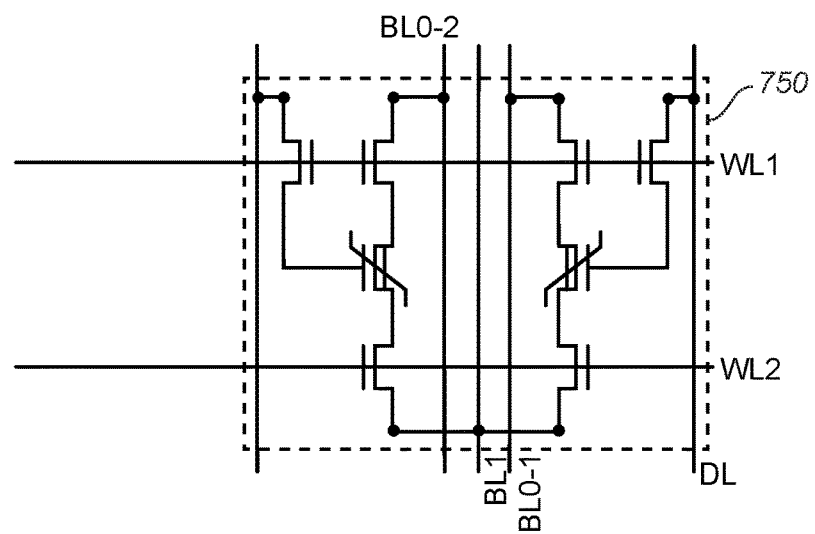
FIG. 7(b) shows adjacent memory cells in the memory array of FIG. 7(a) being made mirror images of each other to form a combined memory cell storing a single data bit in complementary forms.

FIG. 7(a) shows FeDFET 701 being used as a storage transistor in memory cell 700, according to one embodiment of the present invention. Memory cell 700 differs from memory cell 600 of FIG. 6(a) by having additional select transistor 704, which is activated by word line WE1, to connect the gate electrode of FeDFET 701 to drive line DL. As in memory cell 600 of FIG. 6(a), adjacent memory cells in the memory array of FIG. 7(a) may be made mirror images of each other to form combined memory cell 750, which store a single data bit in complementary forms, as shown in FIG. 7(b). In FIG. 7(b), the two adjacent memory cells share bit line BL1 for read access, in conjunction with word lines WE2 and WE1, drive line DL and bit lines BL1-1 and BL2-2. Write data access is achieved using word line WE1, drive line DL and bit lines BL1-1 and BL1-2.

Figure 8A:
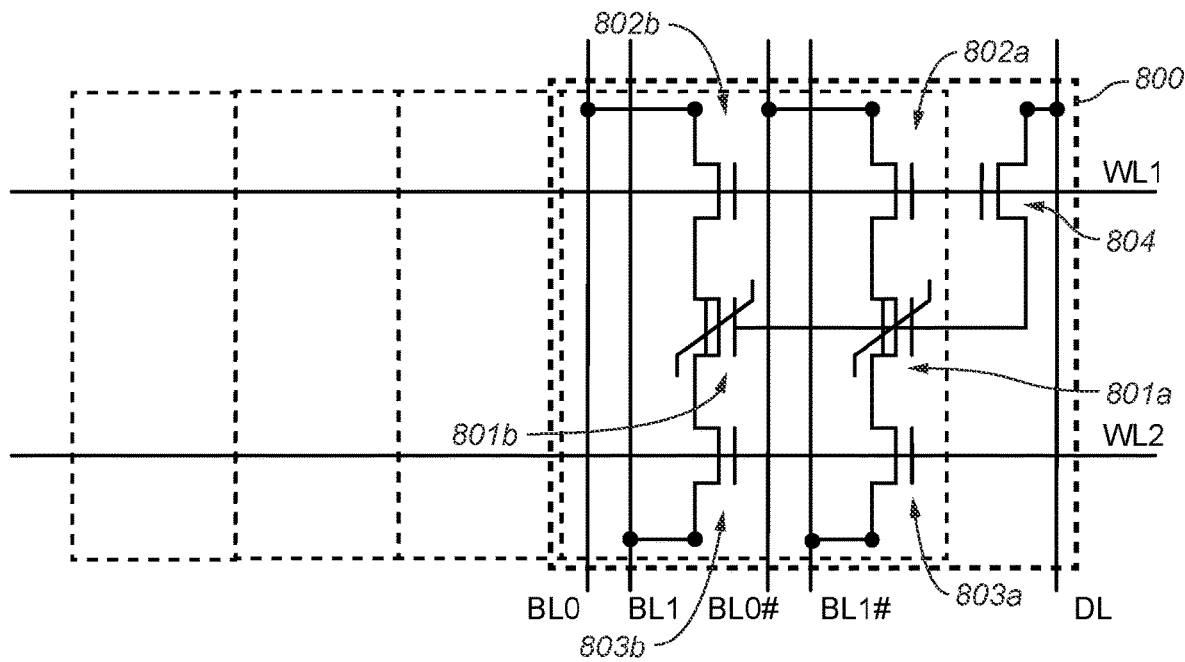
FIG. 8(a) shows FeDFETs 801a and 801b being used as storage transistors in memory cell 800 to store a data bit in complementary forms, according to one embodiment of the present invention.
Figure 8B:
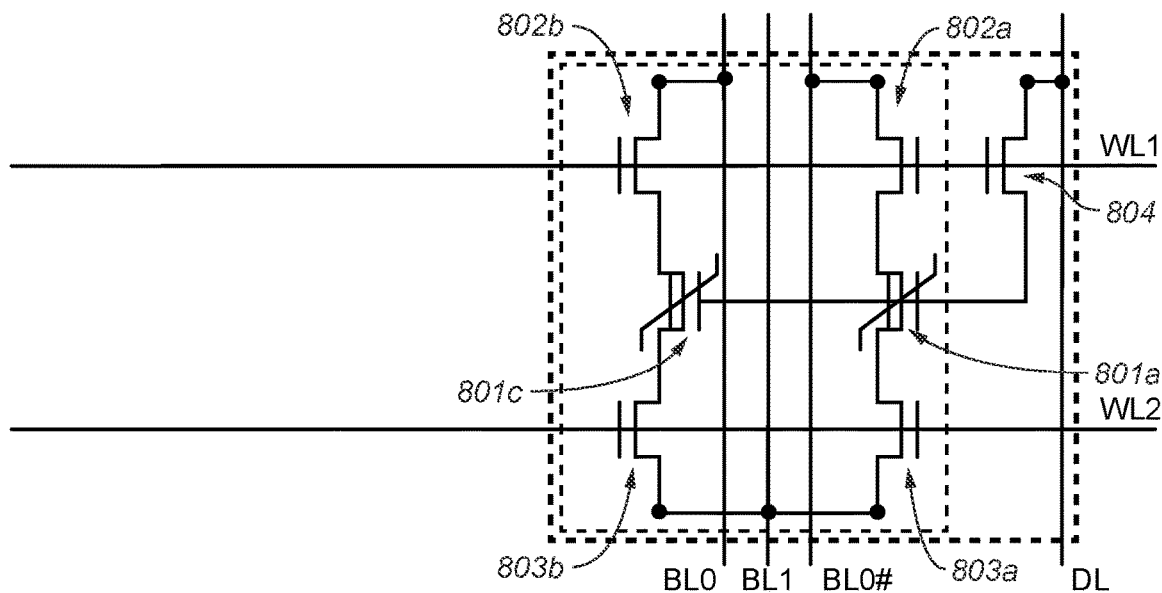
FIG. 8(b) shows memory cell 850, which is a variation of memory cell 800, with FeDFETs 801a and 801b sharing bit line, thereby eliminating bit line BL1 #.

FIG. 8(a) shows FeDFETs 801a and 801b being used as storage transistors in memory cell 800 to store a data bit in complementary forms, according to one embodiment of the present invention. As shown in FIG. 8(a), FeDFET 801a is accessed for through select transistors 802a and 803a, which are controlled by word lines WL1 and WL2, respectively, to or from bit lines BL0 # and BL1 #, while FeDFET 801b is accessed through select transistors 802b and 803b, which are controlled by word lines WL1 and WL2, respectively, to or from bit lines BL0 and BL1. Additional select transistor 804, activated by word line WL1, connects drive line DL to the gate electrodes of FeDFETs 801a and 801b. FIG. 8(b) shows memory cell 850, which is a variation of memory cell 800, with FeDFETs 801a and 801b sharing bit line, thereby eliminating bit line BL1 #.

Figure 9:
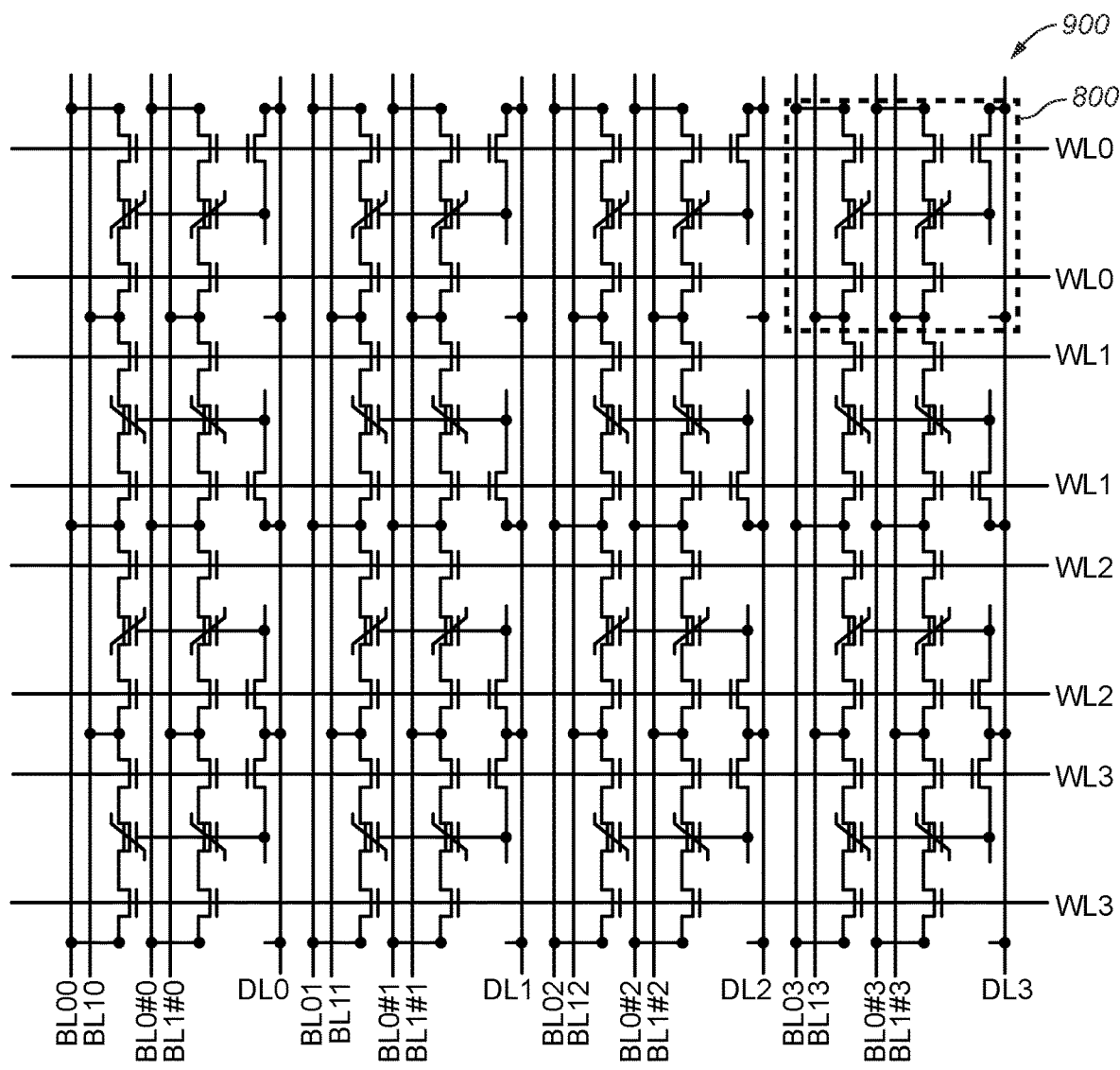
FIG. 9 shows 4×4 memory array 900 of memory cell 800 replications.

Although each shown in FIGS. 6(a), 6(b), 7(a), 7(b), 8(a) and 8(b) in a 1×N memory array, memory cells 600, 650, 700, 750, 800 and 850 may also be replicated in any memory array in 2-dimensions to any M×N configurations. FIG. 9 shows, for example, 4×4 memory array 900 of 16 replications of memory cell 800. In such a memory array, the memory cells in some columns may be used as reference columns, suitable for providing reference voltages for read operations. In 4×4 memory array 900 of FIG. 9, each of memory cells includes its own select transistor to drive line DL (e.g., select transistor 804, in the case when the unit memory cell is either memory cell 800 or memory cell 850). In some embodiment, however, each drive-line select transistor may serve multiple memory cells, as described below in conjunction with FIGS. 12(a) and 12(b). Note that, when the FeDFETs in each memory cell of memory array 900 store independent data bits, memory array 900 implements a 4×8 memory array.

Figure 10A:
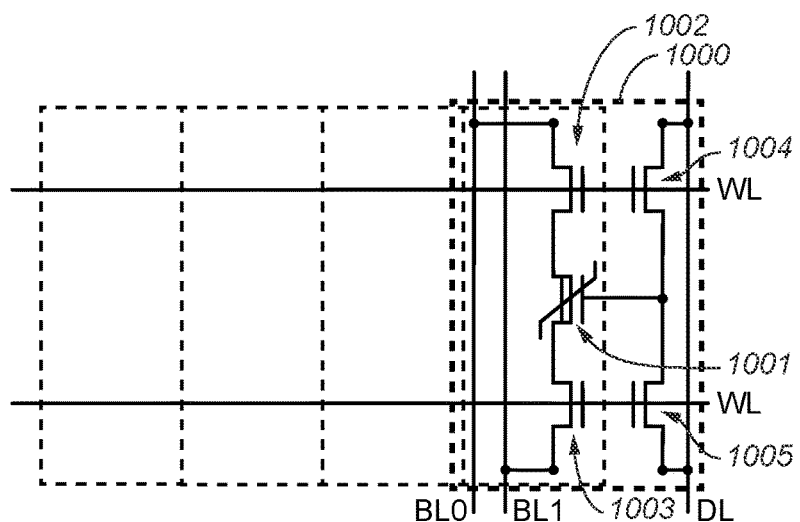
FIG. 10(a) shows FeDFET 1001 being used as a storage transistor in memory cell 1000, according to one embodiment of the present invention.
Figure 10B:
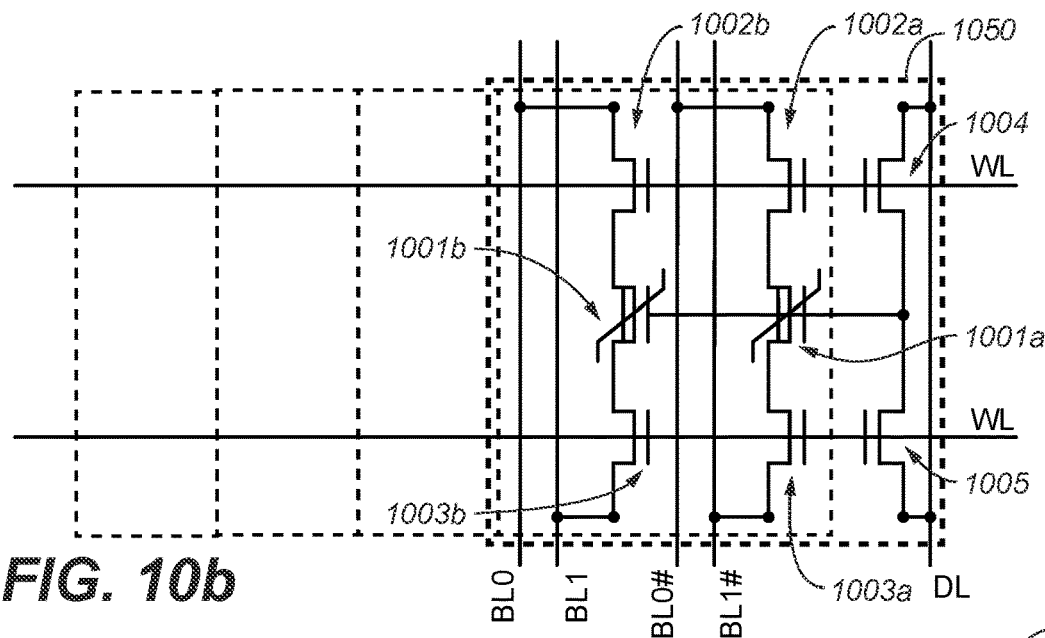
FIG. 10(b) shows, in memory cell 1050, drive-line select transistors 1004 and 1005 being shared by FeDFETs 1001a and 1001b, which may be operated as two single-bit memory cell or as a single-bit memory cell storing the data bit in complementary forms, in accordance with one embodiment of the present invention.

FIG. 10(a) shows FeDFET 1001 being used as a storage transistor in memory cell 1000, according to one embodiment of the present invention. Memory cell 1000 differs from memory cell 700 of FIG. 7(a) by having two drive-line select transistors 1001 and 1002, which are both activated by folded word line WL. Both drive-line select transistors 1001 and 1002 connect the gate electrode of FeDFET 1001 to drive line DL. As in memory cell of FIG. 7(a), adjacent memory cells in memory array 1000 of FIG. 10(a) may be made be incorporated to form a combined memory cell that stores a single data bit in complementary forms. Drive-line select transistors 1004 and 1005 may be shared by two or more FeDFETs, such as shown in FIG. 10(b) in memory cell 1050. Memory cell 1050, having FeDFETs 1001a and 1001b, may be operated as two single-bit memory cell or as a single-bit memory cell storing the data bit in complementary forms. When operated as a single-bit memory cell, one of bit lines BL0 or BL1 in memory cell 1050 may be shared in the manner described above. Alternatively, folded word line WL in memory cell 1050 may comprise independent read enable (RE) line and word line WL.

Figure 11:
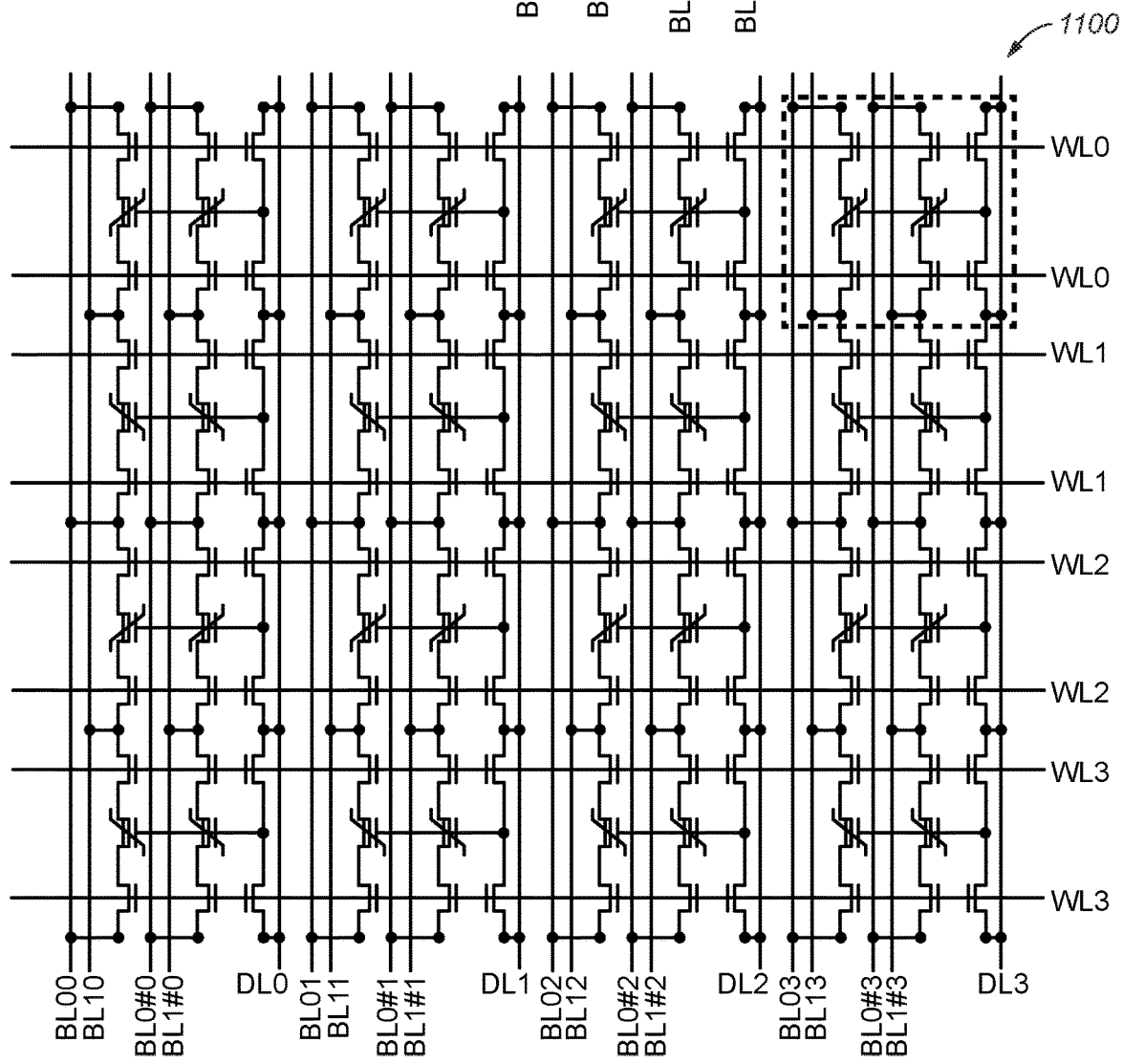
FIG. 11 shows 4×4 memory array 1100 of 16 replications of memory cell 1050, in accordance with one embodiment of the present invention.

FIG. 11 shows 4×4 memory array 1100 of 16 replications of memory cell 1050, in accordance with one embodiment of the present invention. As in memory array 900, the memory cells in some columns may be used as reference columns, suitable for providing reference voltages for read operations. Note that, the FeDFETs in each memory cell of memory array 1100 store independent data bits, memory array 1100 implements a 4×8 memory array.

Figure 12A:
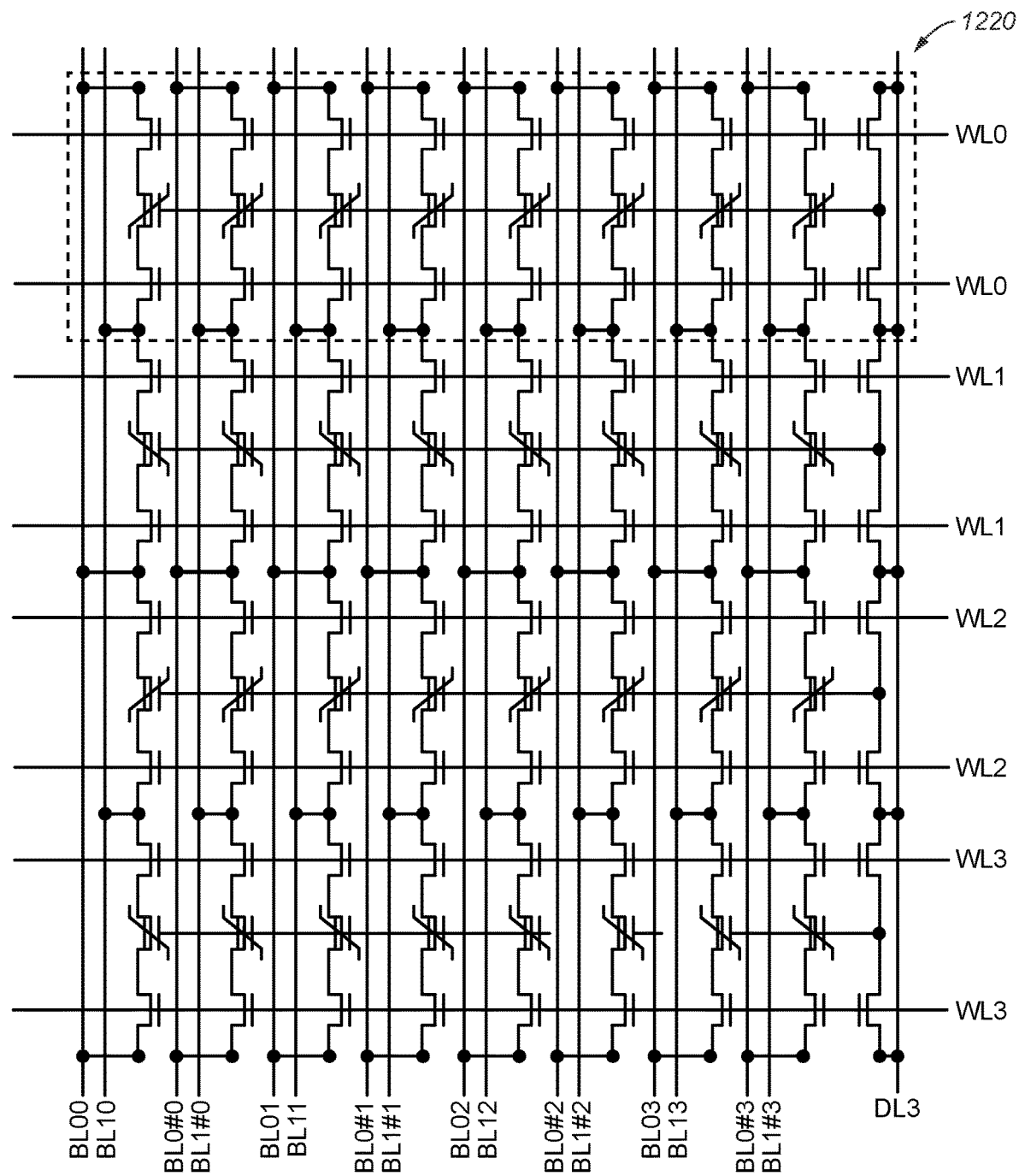
FIGS. 12(a) and 12(b) show, memory arrays 1220 and 1240, in each of which multiple columns of memory cells share a column of drive-line select transistors, in accordance with one embodiment of the present invention.
Figure 12B:
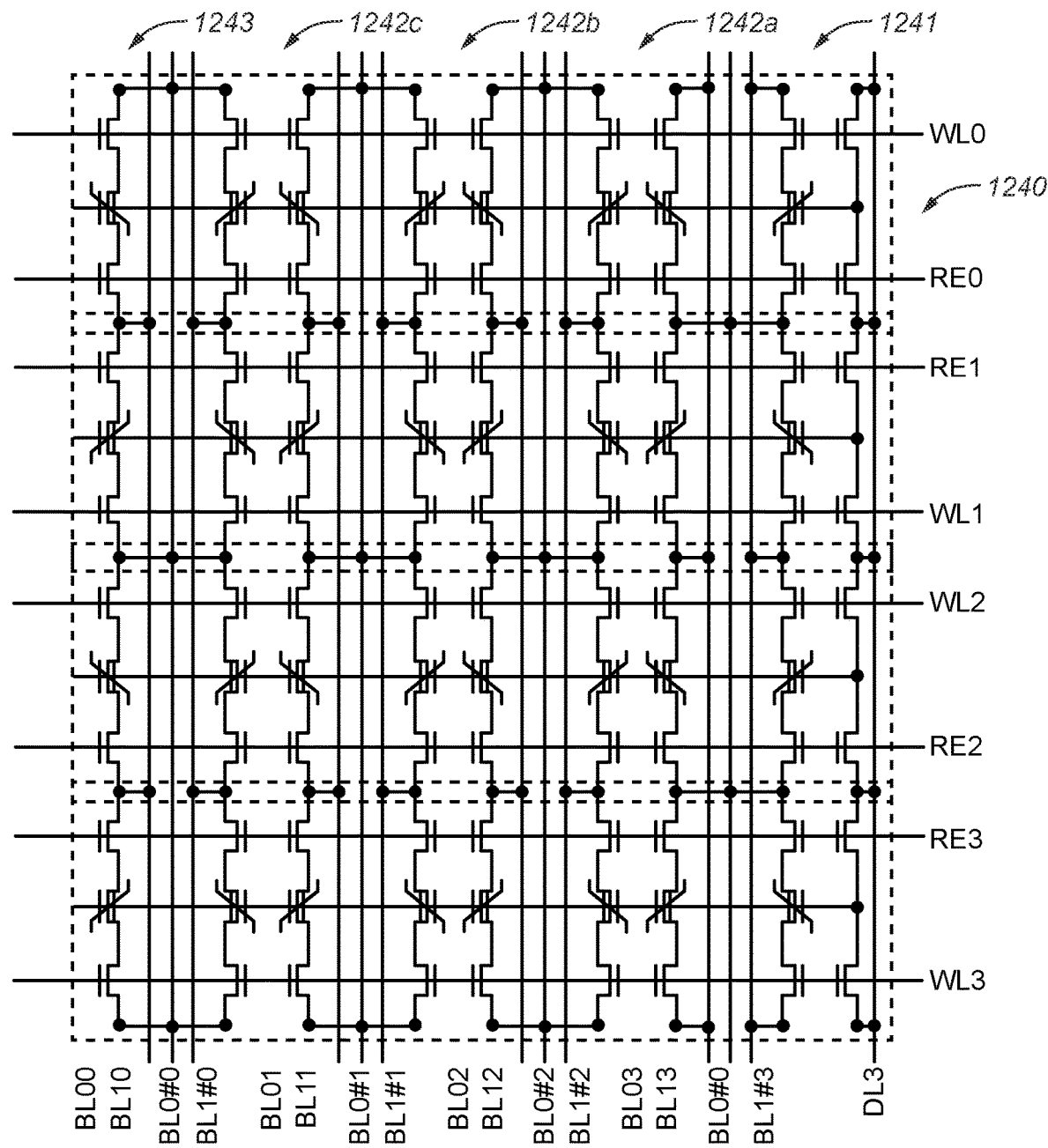

FIGS. 12(a) and 12(n) show, memory arrays 1220 and 1240, in each of which multiple columns of memory cells share a column of drive-line select transistors, in accordance with one embodiment of the present invention. Each of memory arrays 1220 and 1240 may be configured as a 4×4 array of memory cells each with a data bit stored in complementary form, or as a 4×8 array of single-bit memory cells.

Figure 13:
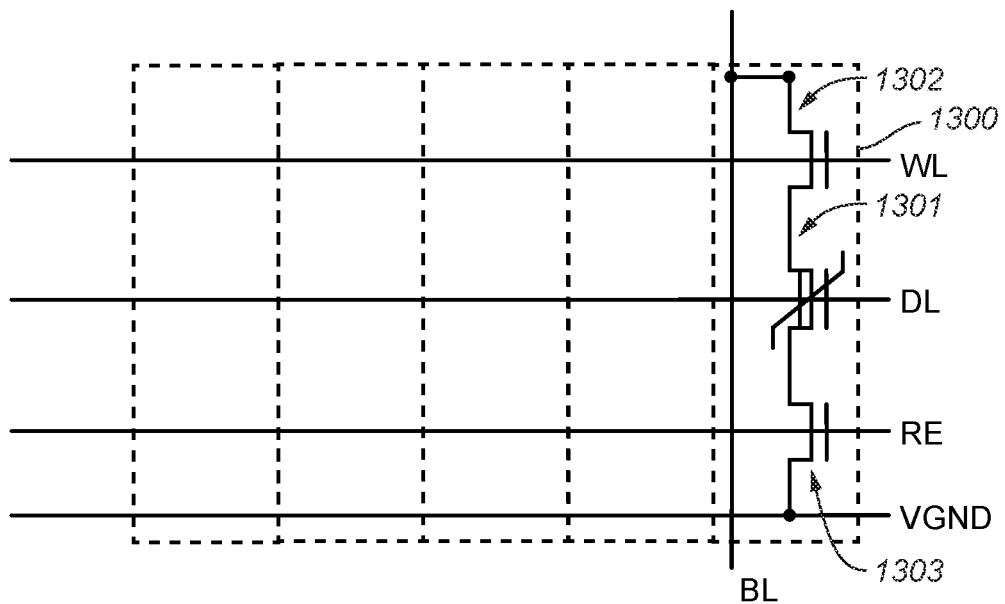
FIG. 13 shows FeDFET 1301 being used as a storage transistor in memory cell 1300, according to one embodiment of the present invention.

FIG. 13 shows FeDFET 1301 being used as a storage transistor in memory cell 1300, according to one embodiment of the present invention. In memory cell 1300, FeD-FET 1301 is accessed for a write operation from select transistor 1302, activated by word line WL, and for a read operation through select transistor 1303, activated by read enable signal RE. However, unlike memory cell 600 of FIG. 6(a), read access select transistor 1303 is connected to constant voltage $V_{GND}$. Under this configuration, memory cell 1300 connects only to single bit line BL. As in memory cell 600 of FIG. 6(b), adjacent memory cells in the memory array of FIG. 13 may form a combined memory cell that stores a single data bit in complementary forms.

Figure 14A:
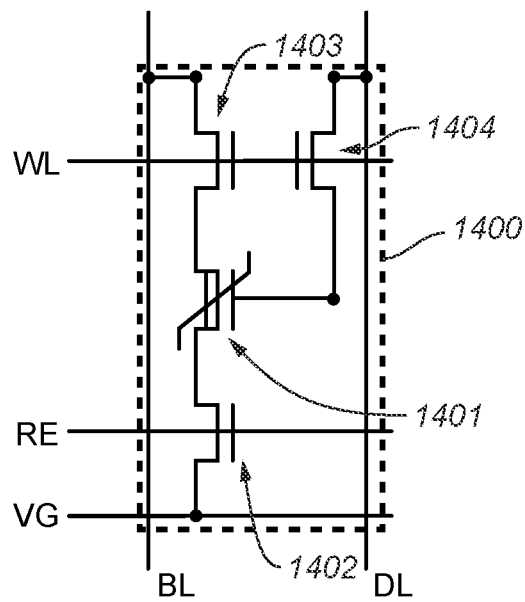
FIG. 14(a) shows FeDFET 1401 being used as a storage transistor in memory cell 1400, according to one embodiment of the present invention.

FIG. 14(a) shows FeDFET 1401 being used as a storage transistor in memory cell 1400, according to one embodiment of the present invention. In memory cell 1400, FeDFET 1401 is accessed for a write operation from select transistor 1403, activated by word line WL, and for a read operation through select transistor 1402, activated by read enable line or word line RE. However, unlike memory cell 700 of FIG. 7(a), read access select transistor 1402 is connected to a constant voltage ($V_{GND}$). In this detailed description, $V_{GND}$ may be a common source voltage ($V_{SS}$), a ground reference voltage, or any suitable low voltage. Under this configuration, memory cell 1400 connects only to single bit line BL. For a write operation word line RE disables select transistor 1402, and word line WL enables a voltage pulse on drive line DL to reach the gate electrode of FeDFET 1401. During a read operation, both select transistors 1403 and 1402 are enabled by the voltages on read enable line RE and word line WL and drive line DL is also at $V_{GND}$. FIG. 14(c) shows memory cell 1450, which incorporates into memory cell 1400 additional FeDFET 1401b, and access transistors 1402b and 1403b.

Figure 14B:
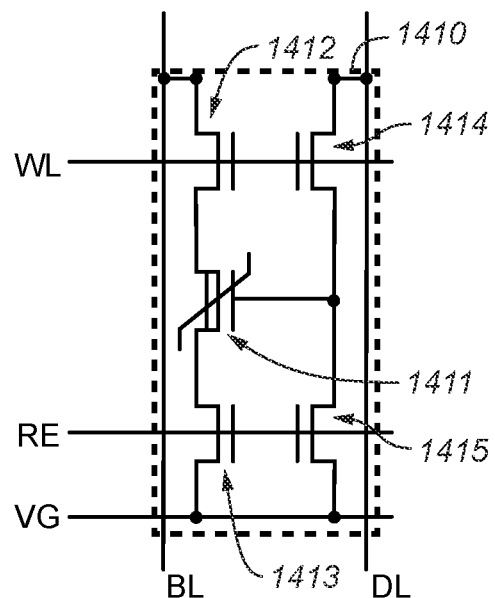
FIG. 14(b) shows FeDFET 1411 being used as a storage transistor in memory cell 1410, according to one embodiment of the present invention.
Figure 14C:
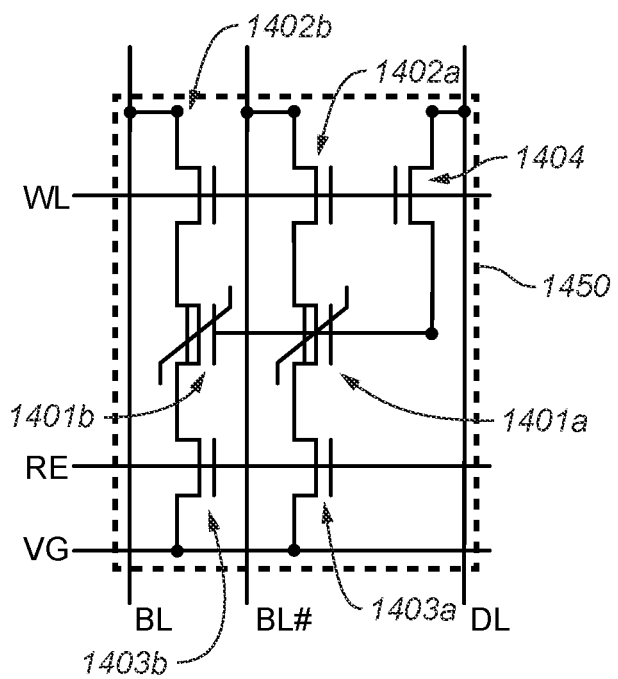
FIG. 14(c) shows memory cell 1450, which incorporates into memory cell 1400 additional FeDFET 1401b, and access transistors 1402b and 1403b.
Figure 14D:
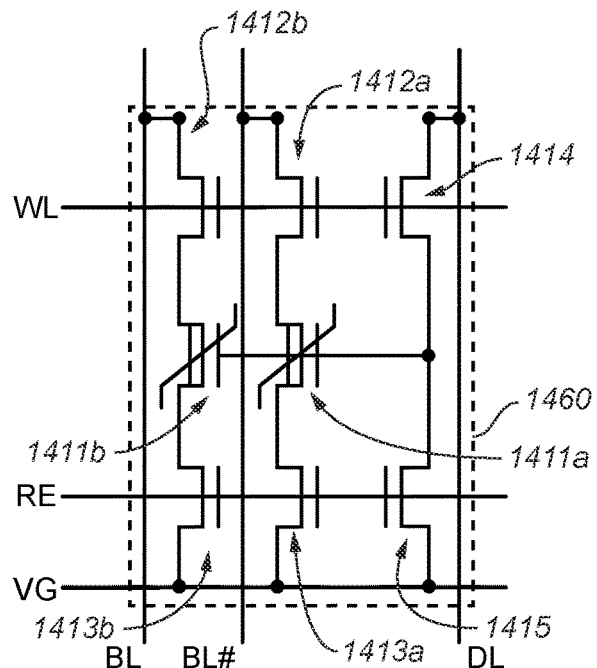
FIG. 14(d) shows memory cell 1460, which incorporates into memory cell 1410 additional FeDFET 1411b, and access transistors 1412b and 1413b.

FIG. 14(b) shows FeDFET 1411 being used as a storage transistor in memory cell 1410, according to one embodiment of the present invention. In memory cell 1410, FeDFET 1411 is accessed for a write operation from select transistor 1412, activated by word line WL, and for a read operation through select transistor 1413, activated by read enable line or word line RE. However, unlike memory cell 1000 of FIG. 10(a), read access select transistor 1413 and read access select transistor 1415 are connected to constant voltage ($V_{GND}$). Additional read access select transistor 1415 connects $V_{GND}$ to the gate electrode of FeDFET 1401. during a read operation. Under this configuration, memory cell 1410 connects only to single bit line BL. For a write operation word line RE disables select transistor 1413, and word line WL enables a voltage pulse on drive line DL to reach the gate electrode of FeDFET 1411. During a read operation, both select transistors 1412 and 1413 are enabled by the voltages on read enable line RE and word line WL and drive line DL is also at $V_{GND}$. FIG. 14(d) shows memory cell 1460, which incorporates into memory cell 1410 additional FeDFET 1411b, and access select transistors 1412b and 1413b.

Figure 14E:
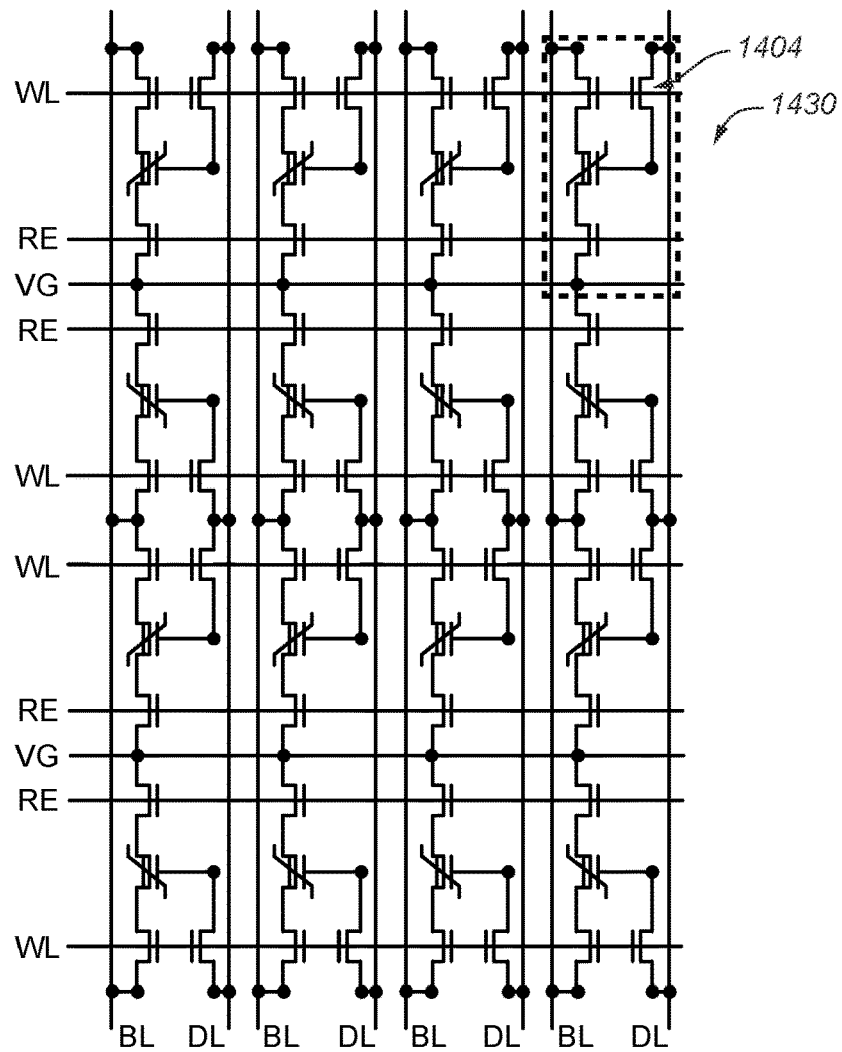
FIG. 14(e) shows, for example, 4×4 memory array 1430 of 16 replications of memory cell 1400 of FIG. 14(a).
Figure 14F:
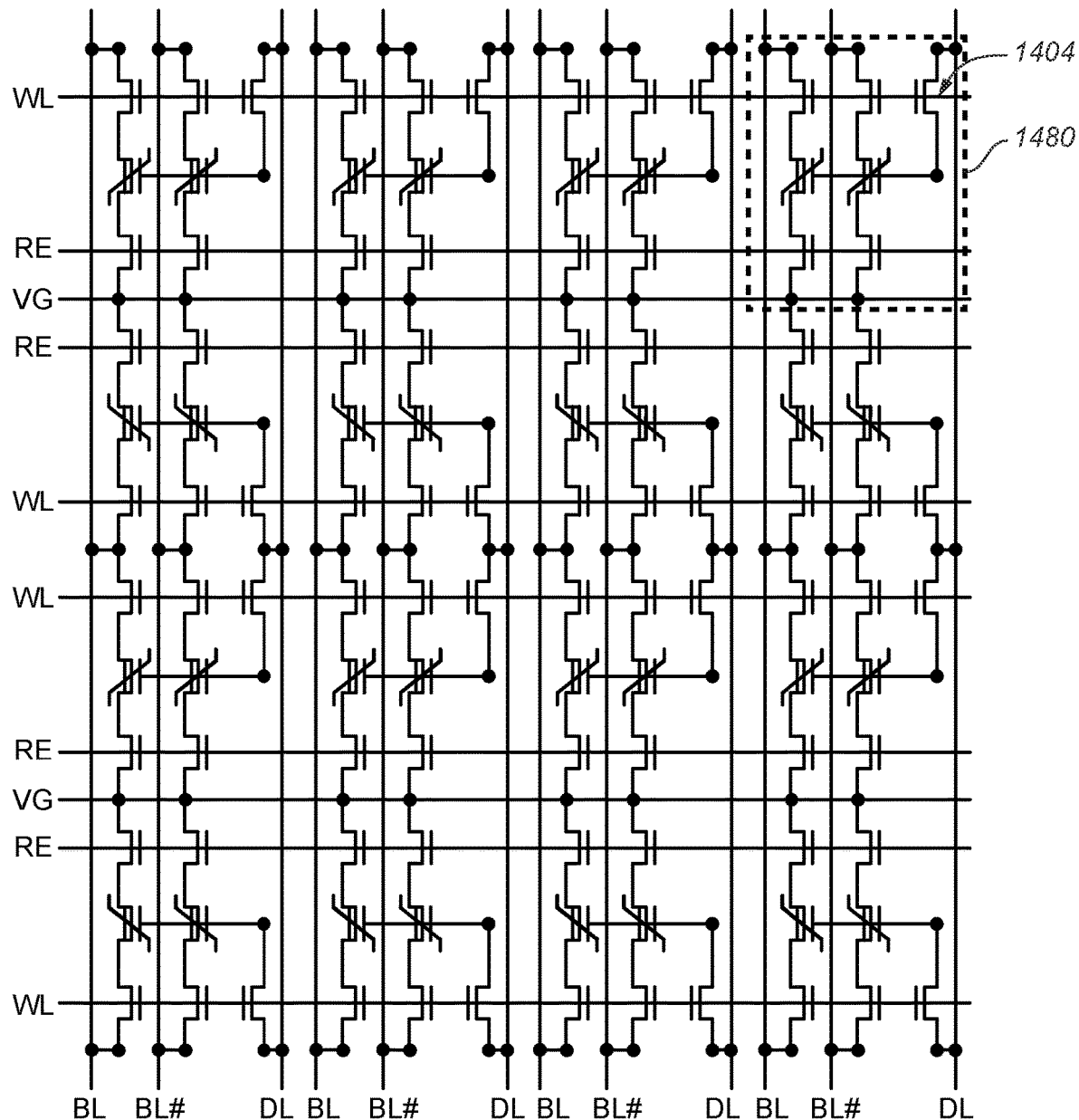
FIG. 14(f) shows 4×4 memory array 1480 of 16 replications of memory cell 1450 of FIG. 14(c).
Figure 14G:
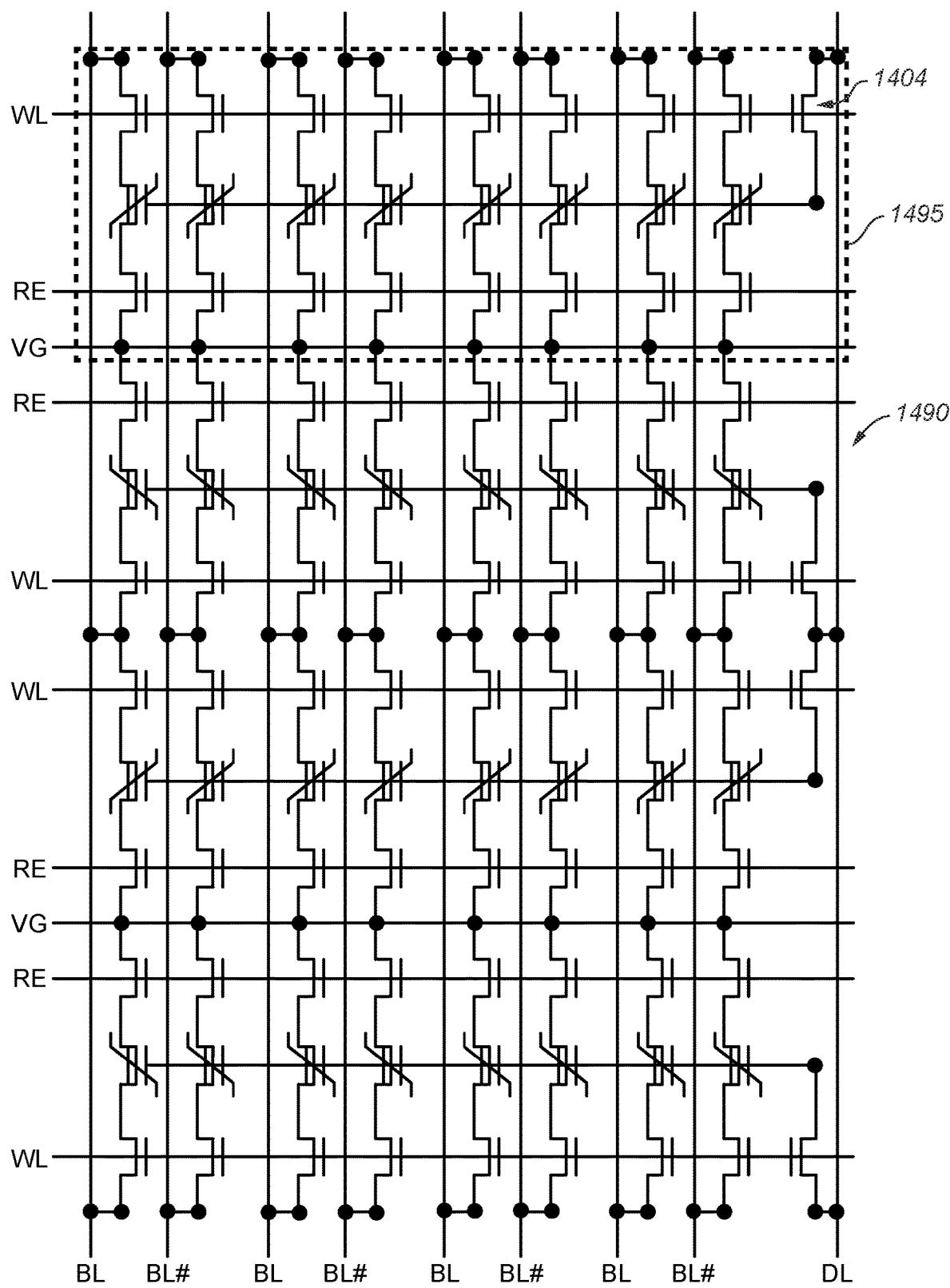
FIG. 14(g) shows 4×1 memory array 1490 having unit memory cell 1495 that incorporates 8 FeDFETs and their respective access select transistors.

FIG. 14(e) shows, for example, 4×4 memory array 1430 of 16 replications of memory cell 1400 of FIG. 14(a). In such a memory array, the memory cells in some columns may be used as reference columns, suitable for providing reference voltages for read operations. In 4×4 memory array 1430 of FIG. 14(e), each of the memory cells include its own select transistor to drive line DL (e.g., drive line select transistor 1404). In some embodiments, however, each drive-line select transistor may serve multiple FeDFETs, as shown in FIGS. 14(f) and 14(g). FIG. 14(f) shows 4×4 memory array 1480 of 16 replications of memory cell 1450 of FIG. 14(c).

FIG. 14(g) shows 4×1 memory array 1490 having unit memory cell 1495 that incorporates 8 FeFDETs and their respective access select transistors. This configuration achieves great storage density. In memory cell 1495, any pair of FeDFETs, whether adjacent or not, can be used to store a single data bit in complementary forms.

In the memory arrays 1430, 1480 and 1490 of FIGS. 14(e)-14(f), one or more columns may be used to provide reference voltages.

Figure 15A:
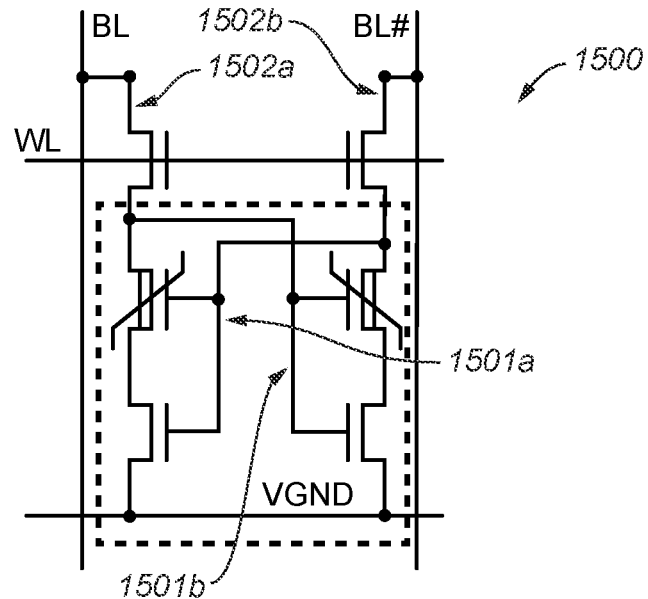
FIG. 15(a) shows static random-access memory (SRAM) cell 1500, including two cross-coupled FeDFET-NMOS devices 1501a and 1501b, each FEDFET-NMOS device includes a FeDFET and an NMOS transistor, in accordance with one embodiment of the present invention.

FIG. 15(a) shows SRAM cell 1500, including two cross-coupled FeDFET-FeDNFET devices 1551a and 1551b, each FeDFET-FeDNFET device includes a FeDFET and a ferro-electric depletion-mode N-type FET (FeDNFET) transistor, in accordance with one embodiment of the present invention. Like SRAM cell 1500 of FIG. 15(a), SRAM cell 1550 may be used in any application in which a conventional CMOS-based SRAM cell may be used (e.g., dual-port and triple-port SRAM applications). SRAM cell 1550 is also believed to have greater single-event upset (SEU) tolerance than the conventional CMOS-based SRAM memory cell. In simulation results, SRAM cell 1550 has even greater noise immunity than SRAM cell 1500 of FIG. 15(a). In addition, the FeDFET-FeDNFET device may have a compact device structure that facilitates manufacturing and reduces cell size.

Figure 15B:
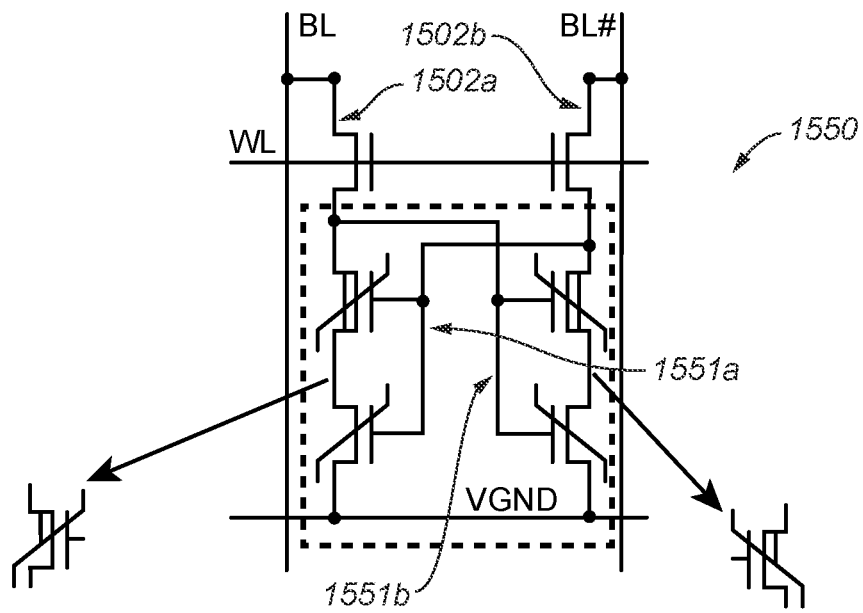
FIG. 15(b) shows SRAM cell 1550, including two cross-coupled FeDFET-FeDNFET devices 1551a and 1551b, each FeDFET-FeDNFET device including a FeDFET and a ferroelectric depletion-mode N-type FET (FeDNFET) transistor, in accordance with one embodiment of the present invention.
Figure 15C:
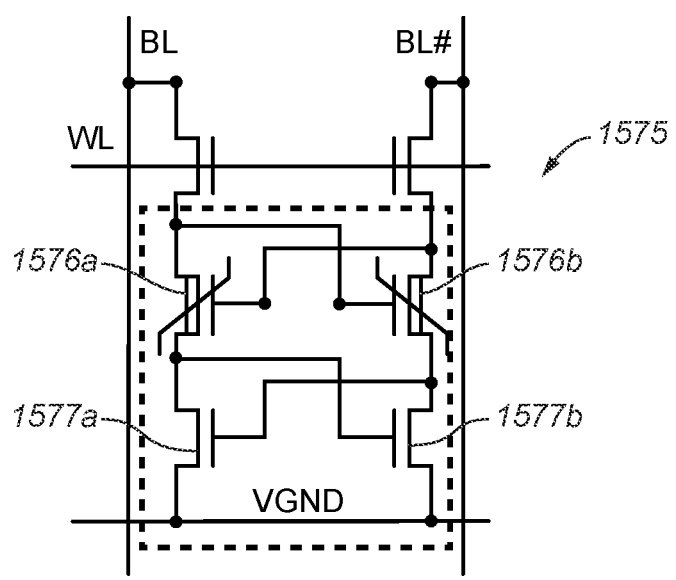
FIG. 15(c) shows another SRAM cell 1575, including cross-coupled FeDFET 1576a and 1576b and cross-coupled NMOS transistors 1577a and 1577b, in accordance with one embodiment of the present invention.

FIG. 15(c) shows another SRAM cell 1575, including cross-coupled FeDFET 1576a and 1576b and cross-coupled NMOS transistors 1577a and 1577b, in accordance with one embodiment of the present invention. SRAM cell 1575 operates in substantially the same manner as SRAM cell 1500 of FIG. 15(a).

Figure 16A:
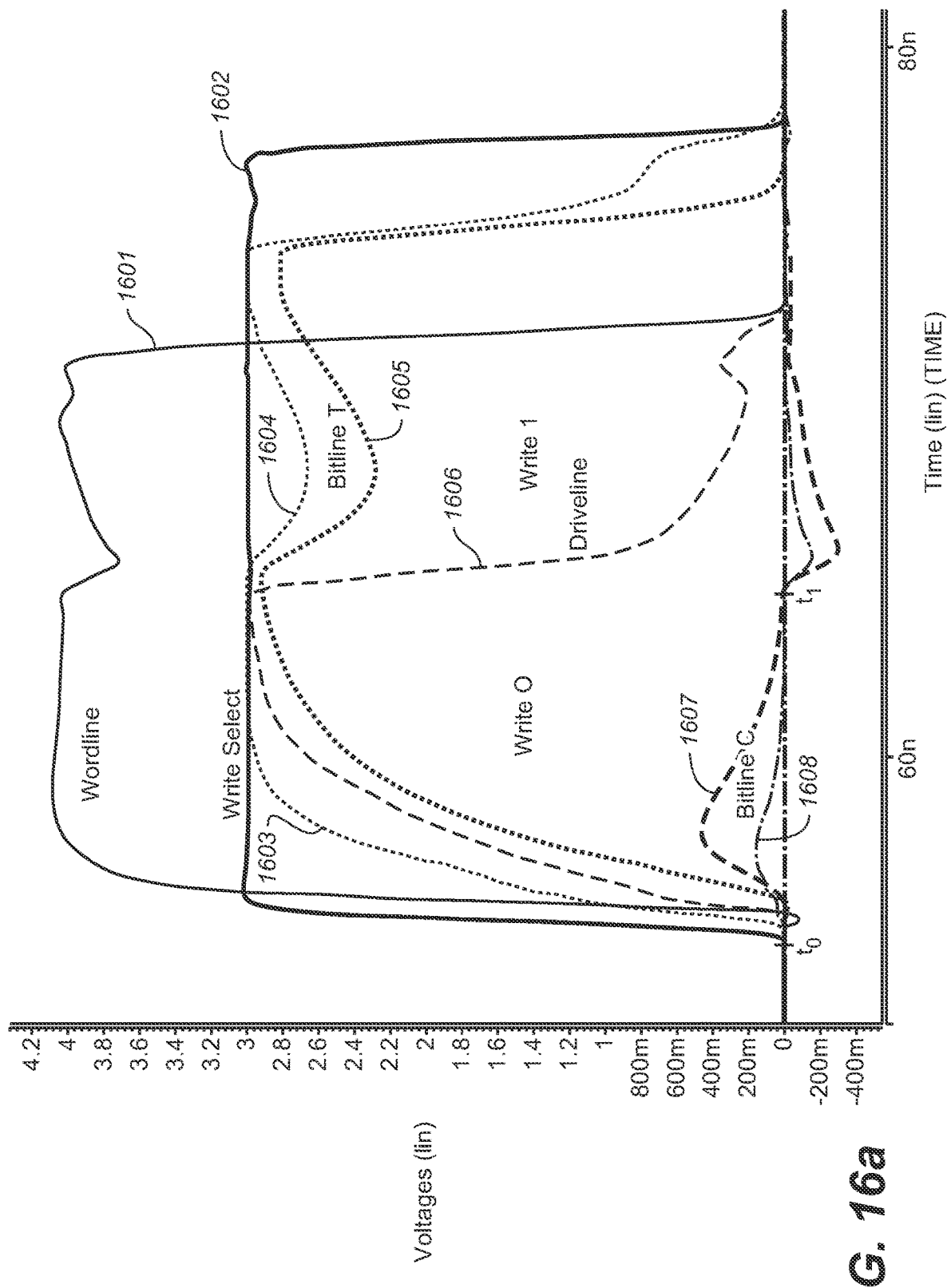
FIG. 16(a) illustrates a destructive write operation for writing into any of the complementary FeDFET memory cells of FIGS. 4-14(g), according to one embodiment of the present invention.

FIG. 16(a) illustrates a destructive write operation for writing into any of the complementary FeDFET memory cells of FIGS. 4-14(g), according to one embodiment of the present invention. As shown in FIG. 16(a), initially, word line WL signal 1601 is asserted to turn on the select transistors that connect the "true" and "complementary" bit lines BLT and BLC to the respective drain or source terminals of the FeDFETs in the memory cell. At the same time, write select signal 1602 is asserted to enable a write operation by, for example, turning off the select transistors to isolate the other drain or source terminals of the FeDFETs from the $V_{SS}$, $V_{GND}$, or the suitable voltage that they would otherwise be connected. Initially, the voltage on drive line signal 1603 (DL) at the gate terminals of the FeDFETs is at a positive voltage relative to the voltage on bit line BLC signal 1608, so that an "on" programmed state or "0" is written into the "complementary" side of the memory cell (i.e., the FeDFET or "Cell C" associated with bit line BLC). Thereafter, at time $t_1$, drive line signal 1603 goes to a low voltage, such that an "off" programmed state or "1" is written into the "true" side of the memory cell (i.e., the FeDFET or "Cell T" associated with bit line BLT). Alternatively, if drive line DL is initially at a positive voltage relative to bit line BLT, represented by waveform 1605, an "on" programmed state or "0" into the "true" side of the memory cell (i.e., the FeDFET or "Cell T" associated with the bit line BLT). In that case, an "off" programmed state or "1" is written into the "true" side of the memory cell.

For a single-FeDFET memory cell (i.e., not storing data in complementary forms), the voltage on drive line signal DL 1605 writes an "on" programmed state or "0" into the memory cell prior to time $t_1$, which may not be intended value to be written into the memory, In that case, at time $t_1$, drive line signal DL 1605 is driven to a low voltage, as shown in FIG. 16(a) to programmed an "off" programmed state or "1" into the memory cell. Otherwise, drive line signal DL 1605 remains at the high voltage to preserve the "off" programmed state or "0" written prior to time $t_1$.

Figure 16B:
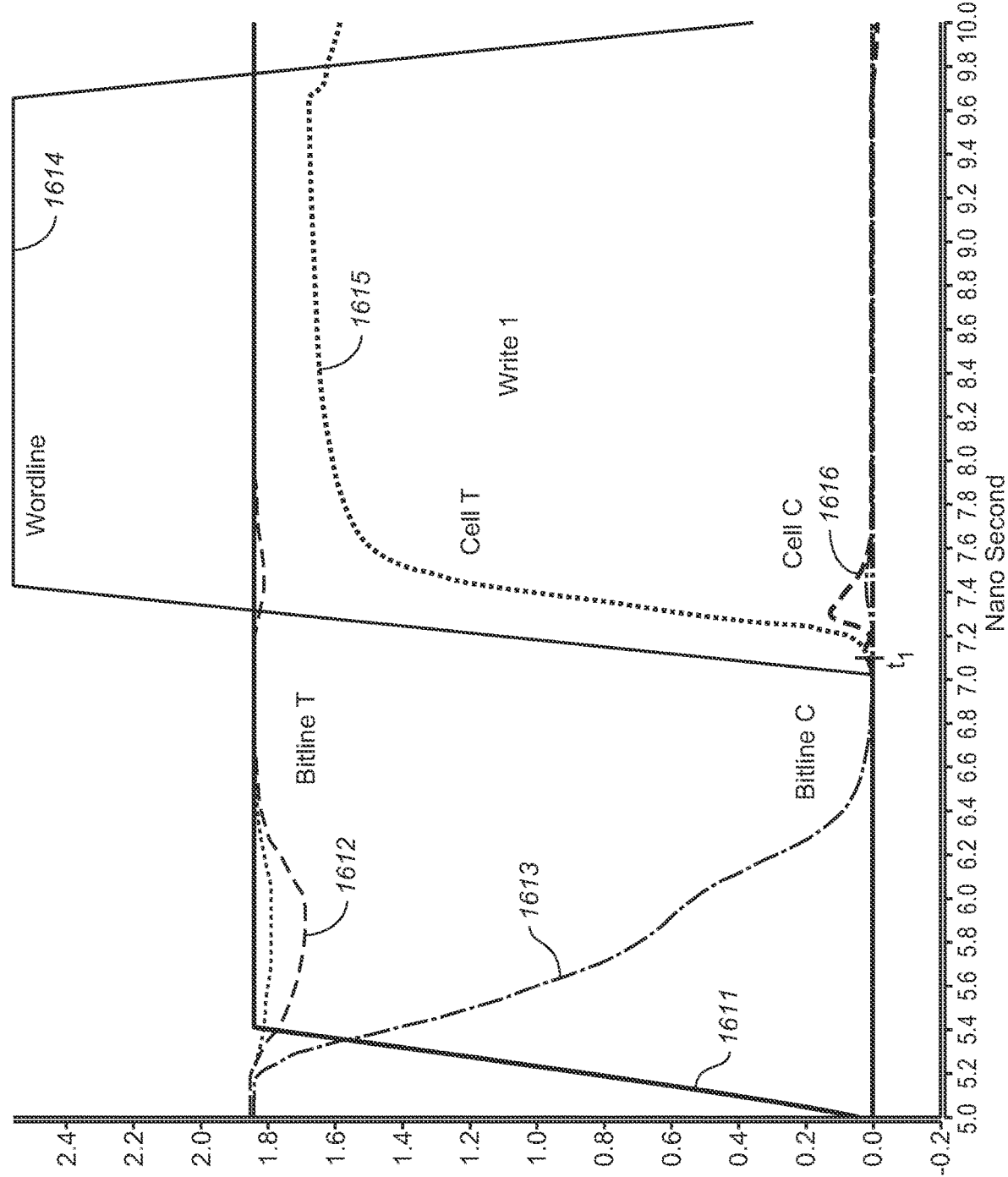
FIG. 16(b) illustrates a non-destructive write operation for writing into any of the SRAM cells in FIGS. 15(a)-15(c), according to one embodiment of the present invention.

FIG. 16(b) illustrates a non-destructive write operation for writing into any of the SRAM cells in FIGS. 15(a)-15(c), according to one embodiment of the present invention. The cross-coupling of the FeDFETs in the SRAM cell provides the advantage that the FeDFETs are continuously being reinforced, even after word line WL is de-asserted. As a result, there is virtually no timing constraint for the write operation. As shown in FIG. 16(b), word select signal 1611 is asserted to initiate a write operation. In this example, bit line signals 1612 (BLT) and 1613 (BLC) are stable before word line signal 1614 is asserted at time $t_1$. When word line signal 1614 is asserted, the voltage on bit line BLT signal 1612 is imposed on the gate terminal of the "complementary" side FeDFET, resulting in a positive voltage difference between the gate terminal of the "complementary" side FeDFET and the low voltage or ground reference at its source terminal, thereby programming an "on" state or "0" in the "complementary" side FeDFET. At the same time, bit line signal BLC 1613 is imposed on the gate terminal of the "true" side FeDFET, resulting in a negative voltage difference between the gate terminal of the "true" side FeDFET and the voltage of word line BLT signal 1612 at its source terminal, thereby programming an "off" state or "1" in the "true" side FeDFET.

Alternatively, if bit line signal BLT 1612 is less than bit line signal BLC 1613, unlike the previous example, when word line signal 1614 is asserted at time $t_1$, the voltage on bit line BLC signal 1613 is imposed on the gate terminal of the "true" side FeDFET, resulting in a positive voltage difference between the gate terminal of the "true" side FeDFET and the low voltage or ground reference at its source terminal, thereby programming an "on" state or "0" in the "true" side FeDFET. At the same time, bit line signal BLT 1612 is imposed on the gate terminal of the "complementary" side FeDFET, resulting in a negative voltage difference between the gate terminal of the "complementary" side FeDFET and the voltage of word line BLT signal 1612 at its source terminal, thereby programming an "off" state or "1" in the "complementary" side FeDFET.

Thus, the FeDFET SRAM cell of any of FIGS. 15(a)-15(c) operates substantially the same manner as a conventional SRAM circuit.

Figure 16C:
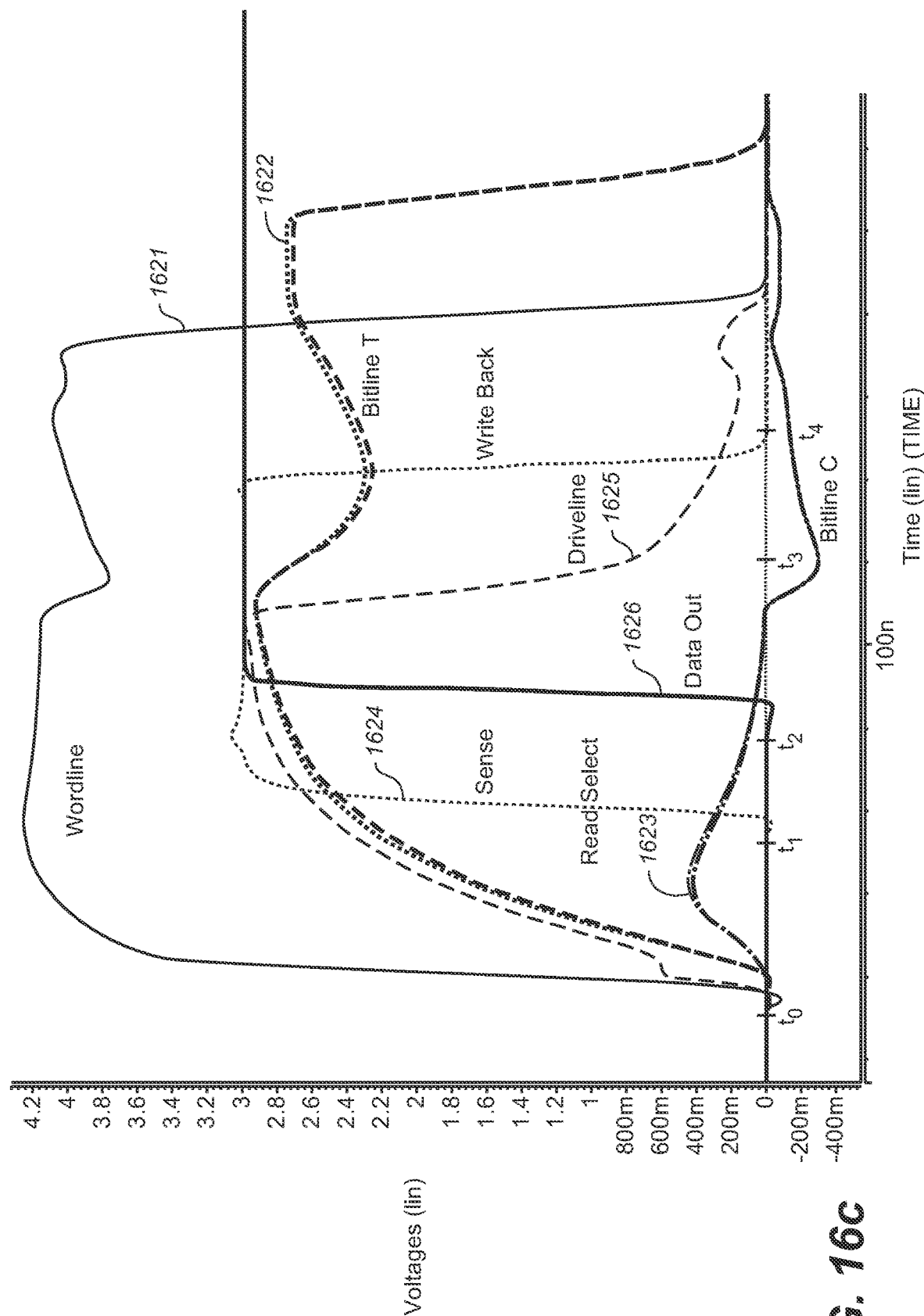
FIG. 16(c) illustrates a destructive read operation for writing into any of the complementary FeDFET memory cells of FIGS. 4-14(g), according to one embodiment of the present invention.

FIG. 16(c) illustrates a destructive read operation for writing into any of the complementary FeDFET memory cells of FIGS. 4-14(g), according to one embodiment of the present invention. As shown in FIG. 16(c), initially, bit line signals BLT 1622 and BLC 1623 are pre-charged to a suitable voltage level. At time to, word line signal WL 1621 is asserted to connect corresponding drain or source terminals of the FeDFETs in the memory cell to bit line signals BLT 1622 and BLC 1623. At the same time, drive line signal DL 1625 raises the voltages at the gate terminals of the FeDFETs, thereby allowing the programmed states in the FeDFETs to drive bit line signals BLT 1622 and BLC 1623 away from the pre-charged voltage. In the example of FIG. 16(c), bit line signal BLT 1622 has a higher voltage relative to bit line signal BLC 1623. At time $t_1$, read select signal 1624 is asserted to connect the other drain or source terminals of the FeDFETs to a predetermined voltage (e.g., $V_{SS}$, $V_{GND}$, or another suitable voltage) to enable the read operation. A sense amplifier samples the voltages on bit line signal BLT 1622 and BLC 1623 and resolves the data value stored in the memory cell to provide output signal 1626. In this example, this read operation may be change the "off" programmed state of Cell T to the "on" programmed state. Thus, at time $t_3$, drive line signal DL 1625 is driven to a low voltage prior to time $t_4$, when read select signal 1624 is de-asserted, so that an "off" programmed state or "1" may be written back into the "true" side FeDFET of the memory cell. Alternatively, for the case where the opposite value is stored in the memory cell, at time $t_4$, the "off" programmed state or "1" is written back into the "complementary" side FeDFET of the memory cell.

For a single-FeDFET memory cell (i.e., not storing data in complementary forms), the read operation may change an "off" state in the FeDFET of the memory cell to an "on" programmed state. In that case, drive line signal DL 1625 is driven to a low voltage prior to time $t_4$, when read select signal 1624 is de-asserted, to restore an "off" programmed state or "1" to the FeDFET of the memory cell, as shown in FIG. 16(c). Otherwise, drive line signal DL 1605 remains at the high voltage to allow the FeDFET of the memory cell to remain in the "on" state.

Figure 16D:
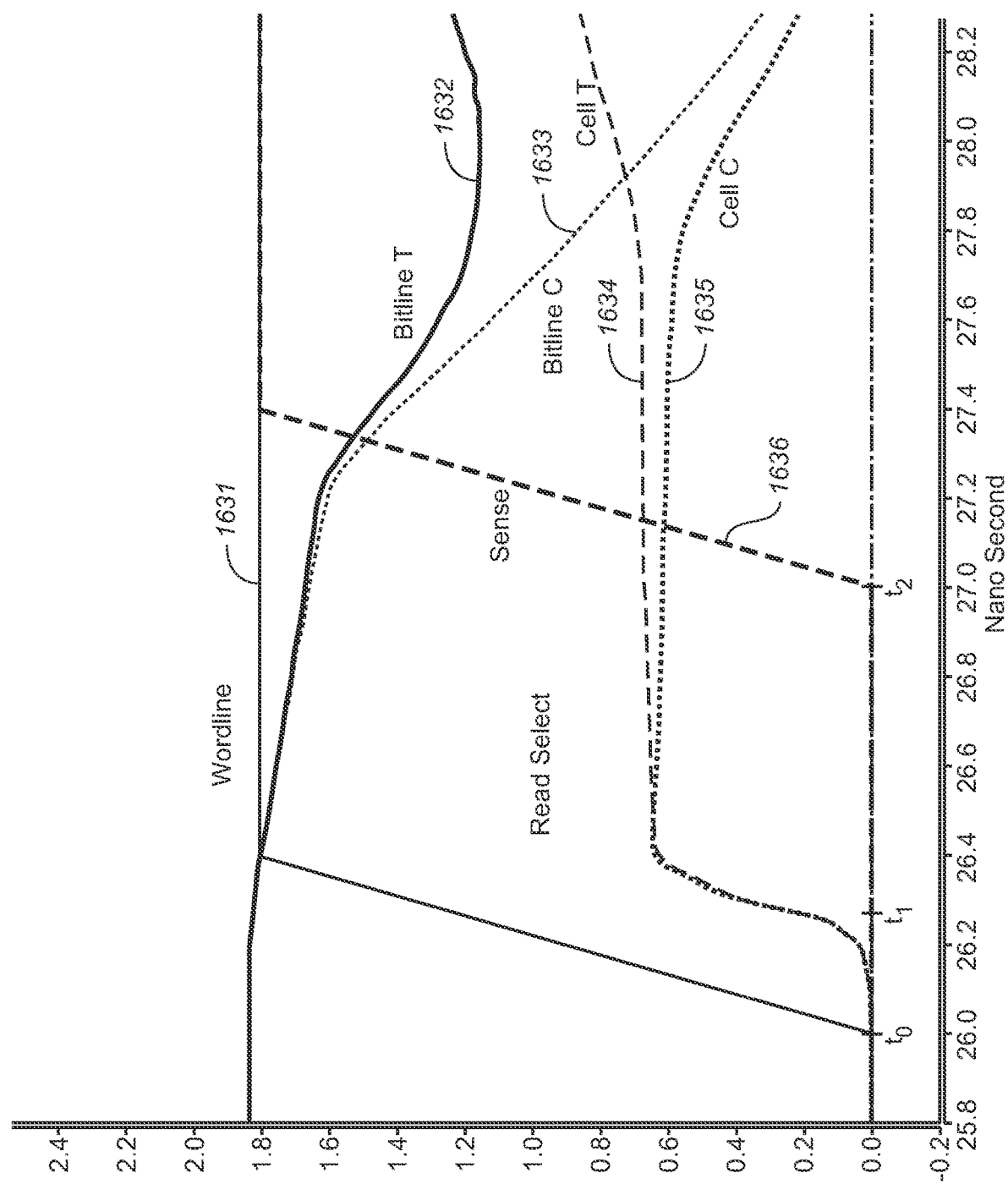
FIG. 16(d) illustrates a non-destructive read operation for reading any of the SRAM cells in FIGS. 15(a)-15(c), according to one embodiment of the present invention.

FIG. 16(d) illustrates a non-destructive read operation for reading any of the SRAM cells in FIGS. 15(a)-15(c), according to one embodiment of the present invention. Initially, as shown in FIG. 16(d), bit line signals BLT 1632 and BLC 1633 are pre-charged to a suitable voltage. At time to, word line signal 1631 is asserted to connect the "true" side FeDFET ("Cell T") and "complementary" side FeDFET ("Cell C"), respectively, to bit line signals BLT 1632 and BLC 1633. Charge sharing between bit line signals BLT 1632 and BLC 1633 and the gate terminal signals 1634 and 1635 of Cell T and Cell C, respectively, pull the gate terminal signals 1634 and 1635 of Cell T and Cell C to a suitable intermediate voltage. At time $t_2$, read select signal 1636 is selected to allow sensing of bit line signals BLT 1632 and BLC 1633 at a sense amplifier. Bit line signals BLT 1632 and BLC 1633 are then gradually driven to their stable values. The cross-coupling of the Cell T and Cell C results also in their gate terminal signals 1634 and 1635 to be driven towards the stable values of bit line signals BLT 1632 and BLC 1633. Hence, the FeDFET SRAM cell of any of FIGS. 15(a)-15(c) operates substantially the same manner as a conventional SRAM circuit.

The above detailed description is provided to illustrate specific embodiments of the present invention and is not intended to be limiting. Numerous modifications and variations within the scope of the present invention are possible. The present invention is set forth in the accompanying claims.

I claim:

1. A memory circuit, organized as one or more memory cells, the memory circuit further comprising a plurality of word lines, one or more drive lines, and a plurality of bit lines, wherein each memory cell comprises:
   first and second select transistor each having first and second drain or source regions and a gate electrode; and
   first and second ones of the storage transistors, wherein (a) the gate electrode of the first select transistor is connected to a first word line, and the gate electrode of the second select transistor is connected to the first word line or a second one of the word lines; (b) (i) the first drain or source region of the first select transistor is connected to a first one of the bit lines and the second drain or source region of the first select transistor is connected to the first drain or source region of the first storage transistor, and (ii) the first drain or source region of the second select transistor is connected to a second one of the bit lines or to a reference voltage source and the second drain or source region of the second select transistor is connected to the first drain or source region of the second storage transistor; (c) the second drain or source regions of the first and second storage transistors are connected to each other; (d) the gate electrodes of the first and second storage transistors are each connected to one of the drive lines; and (e) the first storage transistor and the second storage transistor each comprise a depletion mode ferroelectric transistor.

2. The memory circuit of claim 1, the memory circuit further comprising one or more drive line select transistors that connect, in each memory cell, the gate electrodes of the first and second storage transistors to their respective drive lines.

3. The memory circuit of claim 1 wherein, in one of the memory cells, the drive line select transistor associated with the drive line connected to the gate electrode of the first storage transistor is controlled by the first word line.

4. The memory circuit of claim 1, wherein two adjacent memory cells form a memory cell of complementary data.

5. The memory circuit of claim 4, wherein the two of the select transistors of the adjacent memory cells are connected to the same bit line.

6. The memory circuit of claim 1, wherein the word lines and the drive lines are laid out parallel to each other.

7. The memory circuit of claim 1, wherein the bit lines and the drive lines are laid out parallel to each other.

8. The memory circuit of claim 1 wherein, in one of the memory cells, the first and the second word lines are segments of a folded word line.

9. The memory circuit of claim 1, wherein the memory cells are organized into 2-dimensional arrays.

* * * * *